(12) United States Patent
Carvalho et al.

(10) Patent No.: US 12,395,128 B1
(45) Date of Patent: Aug. 19, 2025

(54) DECOMPOSITION OF SIGNALS INTO A SUM OF TRUNCATED FOURIER SERIES

(71) Applicant: QDAComm LLC, Raleigh, NC (US)

(72) Inventors: Paulo Carvalho, Lisbon (PT); Rui Dinis, Costa da Caparica (PT)

(73) Assignee: QDAComm LLC, Raleigh, NC (US)

( * ) Notice: Subject to any disclaimer, the term of this patent is extended or adjusted under 35 U.S.C. 154(b) by 0 days.

(21) Appl. No.: 19/072,615

(22) Filed: Mar. 6, 2025

(51) Int. Cl.
*H03F 1/02* (2006.01)
*H03F 3/195* (2006.01)

(52) U.S. Cl.
CPC ........... *H03F 1/0294* (2013.01); *H03F 3/195* (2013.01); *H03F 2200/451* (2013.01)

(58) Field of Classification Search
CPC . H03F 1/02; H03F 1/07; H03F 1/0294; H03F 3/04; H03F 3/21; H03F 3/38; H03F 3/193; H03F 3/195; H03F 3/217; H03M 1/00; H03M 13/00; H04L 27/00; H04L 27/26
USPC .......... 330/10, 295, 297; 375/219, 295–297; 455/102, 114.3, 127.3
See application file for complete search history.

(56) References Cited

U.S. PATENT DOCUMENTS

| | | |
|---|---|---|
| 3,777,275 A | 12/1973 | Cox |
| 3,927,379 A | 12/1975 | Cox et al. |
| 5,304,943 A | 4/1994 | Koontz |
| 5,872,481 A | 2/1999 | Sevic et al. |
| 6,208,247 B1 | 3/2001 | Agre et al. |
| 6,320,914 B1 | 11/2001 | Dent |
| 6,359,504 B1 | 3/2002 | Cozzarelli |
| 6,470,055 B1 | 10/2002 | Feher |
| 7,260,368 B1 | 8/2007 | Blumer |
| 7,272,408 B2 | 9/2007 | Dalal et al. |
| 7,480,395 B2 | 1/2009 | Parunak et al. |
| 7,526,261 B2 | 4/2009 | Sorrells et al. |
| 7,629,843 B2 | 12/2009 | Paul et al. |
| 7,715,811 B2 | 5/2010 | Kenington |
| 7,729,675 B2 | 6/2010 | Krone |
| 7,737,786 B2 | 6/2010 | Plaze et al. |
| 7,889,811 B2 | 2/2011 | Byun et al. |
| 7,937,049 B2 | 5/2011 | Phillips et al. |
| 7,941,157 B2 | 5/2011 | Srinivasan et al. |
| 7,979,574 B2 | 7/2011 | Gillo et al. |
| 8,289,084 B2 | 10/2012 | Morimoto et al. |

(Continued)

OTHER PUBLICATIONS

Orthogonal Waveforms and Filter Banks for Future Communication Systems, Edition: 1st, Chapter: 18, pp. 462-485, Elsevier, 2009.

(Continued)

*Primary Examiner* — Shawkat M Ali
(74) *Attorney, Agent, or Firm* — Kaufman & Canoles, P.C.

(57) ABSTRACT

Systems and methods of performing decomposition of baseband and bandpass signals into a sum of time truncated periodic components with spectral masks defined by the set of Fourier coefficients of the components and the pulse used for time truncation are provided. In one exemplary embodiment, a user equipment device includes a circuitry operable to output a set of truncated periodic components that collectively represents a sample of an input signal having information and a set of power amplifier circuitry electrically coupled to the circuitry and operable to amplify the set of truncated periodic components that collectively represents an amplified sample of the input signal.

16 Claims, 11 Drawing Sheets

(56) References Cited

U.S. PATENT DOCUMENTS

| | | | |
|---|---|---|---|
| 8,299,266 | B2 | 10/2012 | Parlanti et al. |
| 8,362,832 | B2 | 1/2013 | Kim et al. |
| 8,451,053 | B2 | 5/2013 | Perreault et al. |
| 9,012,415 | B2 | 4/2015 | Da Silva Correia et al. |
| 9,020,453 | B2 | 4/2015 | Briffa et al. |
| 9,166,528 | B2 | 10/2015 | Sorrells et al. |
| 9,413,303 | B2 | 8/2016 | Mostov et al. |
| 9,438,172 | B2 | 9/2016 | Cohen |
| 9,537,456 | B2 | 1/2017 | Briffa et al. |
| 9,749,786 | B1 | 8/2017 | Pandey et al. |
| 10,069,467 | B1 | 9/2018 | Carvalho et al. |
| 10,338,193 | B2 | 7/2019 | Beko et al. |
| 10,511,359 | B2 | 12/2019 | Carvalho et al. |
| 10,597,316 | B2 | 3/2020 | Gomes De Oliveira et al. |
| 11,095,253 | B2 | 8/2021 | Carvalho et al. |
| 11,211,900 | B2 | 12/2021 | Carvalho et al. |
| 11,265,200 | B2 | 3/2022 | Carvalho et al. |
| 2001/0016013 | A1 | 8/2001 | Feher |
| 2003/0174018 | A1 | 9/2003 | Cooper et al. |
| 2003/0215023 | A1 | 11/2003 | Chang et al. |
| 2004/0202255 | A1 | 10/2004 | Dallal |
| 2005/0032483 | A1 | 2/2005 | Klomsdorf et al. |
| 2006/0006945 | A1 | 1/2006 | Burns et al. |
| 2007/0223622 | A1 | 9/2007 | Bang et al. |
| 2007/0293237 | A1 | 12/2007 | Correal et al. |
| 2009/0311980 | A1 | 12/2009 | Sjoland |
| 2010/0265799 | A1 | 10/2010 | Cevher et al. |
| 2011/0038440 | A1 | 2/2011 | Balbach et al. |
| 2011/0187437 | A1 | 8/2011 | Perrault et al. |
| 2012/0326927 | A1 | 12/2012 | Nikkels |
| 2013/0021104 | A1 | 1/2013 | Schmidt |
| 2013/0301454 | A1 | 11/2013 | Seol et al. |
| 2014/0062793 | A1 | 3/2014 | AlSindi et al. |
| 2014/0350237 | A1 | 11/2014 | da Silva Correia et al. |
| 2015/0221313 | A1 | 8/2015 | Purnhagen et al. |
| 2015/0288437 | A1 | 10/2015 | Raju et al. |
| 2016/0164466 | A1 | 6/2016 | Briffa et al. |
| 2017/0090025 | A1 | 3/2017 | Wang |
| 2017/0279501 | A1 | 9/2017 | Kim et al. |
| 2017/0280281 | A1 | 9/2017 | Pandey et al. |
| 2017/0346559 | A1 | 11/2017 | Eroglu et al. |
| 2018/0138862 | A1 | 5/2018 | Balteanu et al. |
| 2020/0366245 | A1* | 11/2020 | Carvalho ............. H03F 1/0205 |
| 2021/0006207 | A1 | 1/2021 | Carvalho et al. |
| 2021/0359651 | A1 | 11/2021 | Carvalho et al. |

OTHER PUBLICATIONS

P. Laurent, "Exact and approximate construction of digital phase modulation by superposition of amplitude modulation pulses (AMP)", IEEE Transactions, COM-34, pp. 150-160, Feb. 1986.

P. Montezuma et al., "Quantized Digital Amplification with combination over the air—Achieving maximum efficiency on communication links between long range UAVs and satellites," MILCOM 2021—2021 IEEE Military Communications Conference (MILCOM), San Diego, CA, USA, 2021, pp. 802-807.

P. Montezuma, A. Gusmao, "A pragmatic coded modulation choice for future broadband wireless communications", IEEE VTC"01 (Spring), Rhodes, Greece, May 2001.

P. Montezuma, A. Gusmao, "Design of TC-OQAM schemes using a generalized nonlinear OQPSK-type format", Electronic Letters, vol. 35, Issue 11, pp. 860/861, 1999.

P. Reynaert and A. M. Niknejad, "Power combining techniques for RF and mm-wave CMOS power amplifiers," ESSCIRC 2007—33rd European Solid-State Circuits Conference, Munich, Germany, 2007, pp. 272-275.

P. Reynaert and M. Steyaert, RF Power Amplifiers for Mobile Communications, Springer, 2006.

P. S. K. Leung and K. Feher, "F-QPSK—a superior modulation technique for mobile and personal communications", IEEE Trans. Broadcast., vol. 39, pp. 288-294, Jun. 1993.

Paulo Montezuma et al. (Power Efficient Coded 16-OOAM Schemes over Nonlinear Transmitters, 34th IEEE Sarnoff Symposium, May 3-4. 2011. Princeton, NJ, USA.

R. Dinis, A. Gusmao and N. Esteves, "On broadband block transmission over strongly frequency-selective fading channels", IEEE VVireless"03, Calgary, Canada, Jul. 2003.

R. Dinis, A. Gusmao, Nonlinear signal processing schemes for OFDM modulations within conventional or LINO transmitter structures, [in:] European Transactions on Telecommunications, Vo. 19, No., 3, pp. 257-271, Apr. 2008.

R. Dinis, P. Montezuma, N. Souto, J. Silva, Iterative Frequency-Domain Equalization for General Constellations, 33rd IEEE Sarnoff Symposium 2010, Princeton, USA,—Apr. 2010.

R. V. Nee and R. Prasad, OFDM for Wireless Multimedia Communications, 1st ed. Norwood, MA, USA: Artech House, Inc., 2000.

Rangan, S., T.S. Rappaport, and E. Erkip, "Millimeter-wave cellular wireless networks: Potentials and challenges", Proc. IEEE, vol. 102, No. 3, pp. 366-385, Mar. 2014.

Rappaport, T.S., et al., "Millimeter wave mobile communications for 5G cellular: it will work!", IEEE Access, vol. 1, pp. 335-349, May 2013.

S. C. Cripps, RF Power Amplifiers for Wireless Communications. Artech House, 2006.

S. Kousai and A. Hajimiri, "An octave-range watt-level fully-integrated cmos switching power mixer array for linearization and back-off-efficiency improvement", IEEE Journal of Solid-State Circuits, vol. 44, No. 12, pp. 3376-3392, 2009.

S. Shambayati, D. K. Lee, "GMSK modulation for deep space applications", IEEE Aerospace Conference, Montana, USA, Mar. 2012.

Said, H.A., et al., Design and Realization of Digital Pulse Compression in Pulsed Radars Based on Linear Frequency Modulation (LFM) Waveforms Using FPGA, International Conference on Advanced Information and Communication Technology for Education (ICAICTE 2013).

Sim, Jaewoo, et al., Analysis and Design ofDohertyPowerAmplifiers for Digital Pre-distortion Linearizer, Proceedings of Asia-Pacific Microwave Conference 2007.

Sundeep Rangan et al. (Millimeter-Wave Cellular Wireless Networks: Potentials and Challenges, Proceedings of the IEEE I vol. 102, No. 3, Mar. 2014).

T. Aulin, N. Rydbeck and C. Sundberg, "Continuous phase modulation—Part II: Partial response signaling", IEEE Transactions on Communications, Vo. COM-29, pp. 210-215, Mar. 1981.

T. J. Hill, "A non-proprietary, constant envelope, variant of shaped offset QPSK (SOQPSK) for improved spectral containment and detection efficiency", IEEE MILCOM Conference Record, vol. 1, pp. 347-352, California, USA, Oct. 2000.

T. Lee, S. Wang, C. Liu, "FQPSK-O: An improved performance constant envelope modulation scheme for OQPSK", IEEE International Telemetering Conference, San Diego, USA, 1998.

T.S. Rappaport, et al., Milirneter wave mobile communications for 5g cellular: it will work, [in:i Access, IEEE, vol. 1, pp. 335-249, 2013.

W. K. Harrison, J. Almeida, M. R. Bloch, S. W. McLaughlin, and J. Barros, "Coding for secrecy: An overview of error-control coding techniques for physical-layer security", IEEE Signal Process. Mag., vol. 30, No. 5, pp. 41-50, Sep. 2013.

W. Struble, F. McGrath, K. Harrington, P. Nagle and S. Rand, "Understanding linearity in wireless communication amplifiers," GaAs IC Symposium IEEE Gallium Arsenide Integrated Circuit Symposium. 18th Annual Technical Digest 1996, Orlando, FL, USA, 1996.

W. Yuan, Jeffrey S. Walling, "A Multiphase Switched Capacitor Power Amplifier" in IEEE Journal of Solid-State Circuits, vol. 52, No. 5, May 2017 pp. 1320-1330.

W. Yuan, V. Aparin, J. Dunworth, L. Seward and J. S. Walling, "A Quadrature Switched Capacitor Power Amplifier," in IEEE Journal of Solid-State Circuits, vol. 51, No. 5, pp. 1200-1209, May 2016.

Wang, Feipeng, et al., A Monolithic High-Efficiency 2.4-GHz 20-dBm SiGe BiCMOS Envelope-Tracking OFDM Power Amplifier, IEEE Journal of Solid-State Circuits, vol. 42, No. 6, Jun. 2007.

(56) References Cited

OTHER PUBLICATIONS

Wang, Feipeng, et al., Design of Wide-Bandwidth Envelope-Tracking Power Amplifiers for OFDM Applications, IEEE Transactions on Microwave Theory and Techniques, vol. 53, No. 4, Apr. 2005.
Wang, Feipeng, et al., Wideband Envelope Elimination and Restoration Power Amplifier with High Efficiency Wideband Envelope Amplifier for WLAN 802.11g Applications, IEEE 2005.
Wang, Zhancang, Demystifying Envelope Tracking, IEEE, Mar. 6, 2015.
Wolf, Robert, et al., On the Maximum Efficiency of Power Amplifiers in OFDM Broadcast Systems with Envelope Following, MobiLight 2010, LNICST 45, pp. 160-170, 2010.
Y. Li, W. Li, Y. Wang, W. Luo, Y. Lin and H. Xu, "A Compact 144% Fractional Bandwidth CMOS Power Amplifier With an Optimization of Synthesized High-Order Matching Network," 2023 IEEE 15th International Conference on ASIC (ASICON), Nanjing, China, 2023, pp. 1-4.
Zhu, Anding, Decomposed Vector Rotation-Based Behavioral Modeling for Digital Predistortion of RF Power Amplifiers, IEEE Transactions on Microwave Theory and Techniques, vol. 63, No. 2, Feb. 2015.
Zhu, Anding, et al., Open-Loop Digital Predistorter for RF Power Amplifiers Using Dynamic Deviation Reduction-Based Volterra Series, IEEE Transactions on Microwave Theory and Techniques, vol. 56, No. 7, Jul. 2008.
Cappello, Tommaso, et al., Lineraziation of a 500-W L-band GaN Doherty Power Amplifier by Dual-Pulse Trap Characterization, 2019 IEEE/MTT-S International Microwave Symposium.
A Gusmao and N. Esteves, "ENCAP-4: an OQPSK-type modulation technique for digital radio", IEEE Proc. I, Commun. Speech Vis., vol. 135, No. 1, pp. 105-110, Feb. 1988.
A. Araujo, J. Blesa, E. Romero, and O. Nieto-Taladriz, "Artificial noise scheme to ensure secure communications in CWSN," in Proc. 8th Int. Wireless Commun. Mobile Comput. Conf., Limassol, Cyprus, Aug. 2012, pp. 1023-1027.
A. Barenghi, L. Breveglieri, I. Koren, and D. Naccache, "Fault injection attacks on cryptographic devices: Theory, practice, and countermeasures", Proc. IEEE, vol. 100, No. 11, pp. 3056-3076, Nov. 2012.
A. Birafane, M. El-Asmar et al., Analyzing LINC Systems, [in:] Microwave Magazine, IEEE, vol. 11, No. 5, pp. 59-71, Aug. 2010.
A. Gusmao, V. Goncalves, N. Esteves, "A novel approach to modeling of OQPSK type digital transmission over nonlinear radio channels", in IEEE Journal on Selected Areas in Communications, Vo. 15, No. 4, pp. 647-655, 1997.
Alekajbaf Y, Masoumi N, Mohammad-Taheri M, Safavi-Naeini S. A 200 W broadband high power amplifier using hybrid power combining network and digital level control. Int J Rf Microw Comput Aided Eng. 2020.
Aoki, S. D. Kee, D. B. Rutledge, and A. Hajimiri, "Fully Integrated CMOS Power Amplifier Design Using the Distributed Active Transformer Architecture," IEEE J. Solid-State Circuits, vol. 37, No. 3, pp. 371-383, Mar. 2002.
Astucia et al. (Efficient Amplification and Detection of Multilevel SC-FDE Signals Based on BPSK Components, 2013 IEEE Military Communications Conference).
B. Schneier, "Cryptographic design vulnerabilities", IEEE Computer, vol. 31, No. 9, pp. 26-33, Sep. 1998.
Barton, Taylor W., et al., Theory and Implementation of RF-Input Outphasing Power Amplification, IEEE Transactions on Microwave Theory and Techniques, vol. 63, No. 12, pp. 4273-4283, Dec. 2015.
Benvenuto, Nevio et al., Single Carrier Modulation With Nonlinear Frequency Domain Equalization: An Idea Whose Time Has Come—Again, Proceedings of the IEEE, vol. 98, No. 1, Jan. 2010.
C.-F. Chou, Y.-H. Hsiao, Y.-C. Wu, Y.- H. Lin, C.-W. Wu, and H. Wang, "Design of a V-band 20-dBm wideband power amplifier using transformer-based radial power combining in 90-nm CMOS," IEEE Trans. Microwave Theory and Tech, vol. 64, No. 12, pp. 4545-4560, Dec. 2016.

Cao, Tao, et al., S-band 34.2dBm Envelope-Tracking Transmitter with 54% Overall Efficiency Utilizing the High Efficiency and Wideband Envelope Amplifier, IEEE 2019.
Cao, Wenhui, et al., A Modified Decomposed Vector Rotation-Based Behavioral Model With Efficient Hardware Implementation for Digital Predistortion of RF Power Amplifiers, IEEE Transactions on Microwave Theory and Techniques, vol. 65, No. 7, Jul. 2017.
Carvalho, Paulo, Marko Beko, Rui Dinis, Joao Guerreiro, and Pedro Viegas. "Apparatus for quantized linear amplification with nonlinear amplifiers." U.S. Pat. No. 10,069,467, issued Sep. 4, 2018.
Chen, Chi-Tsan, Kahn Envelope Elimination and Restoration Technique Using Injection-Locked Oscillators, IEEE 2012.
Cox, D.C., Linear Amplification with Nonlinear Components, IEEE Transactions on Communications, Dec. 1974.
D. Falconer, S. Ariyavisitakul, A. Benyamin-Seeyar, and B. Eidson, "Frequency domain equalization for single-carrier broadband wireless systems", Communications Magazine, IEEE, vol. 40, No. 4, pp. 58-66, Apr. 2002.
D. Kim, D. Kang, J. Kim, Y. Cho, and B. Kim, "Wideband envelope tracking power amplifier for LTE application", Proc. IEEE Radio Freq. Integr. Circuits Symp. (RFIC), Jun. 2012, pp. 275-278.
E. Yaacoub and M. Al-Husseini, "Achieving physical layer security with massive MIMO beamforming," 2017 11th European Conference on Antennas and Propagation (EUCAP), Paris, France, 2017, pp. 1753-1757.
Falconer, David, et al., Frequency Domain Equalization for Single-Carrier Broadband Wireless Systems, IEEE Communications Magazine, Apr. 2002.
Giannini, Franco, et al., The Doherty Amplifier: Past, Present & Future, IEEE 2015.
Gouba, Abel O., Y. Louet, "Theoretical analysis of the trade-off between efficiency and linearity of the high power amplifier in OFDM context", Proc. Eur. Wireless Conf., Apr. 2012, pp. 1-7.
Gustaffson, David, et al., A GaN MMIC Modified Doherty PA With Large Bandwidth and Reconfigurable Efficiency, IEEE Transactions on Microwave Theory and Techniques, vol. 62, No. 12, Dec. 2014.
H. C. Park, K. Lee and K. Feher, "Continuous phase modulation of spectrally efficient FQPSK signals", IEEE Vehicular Technology Conference, 1988, Philadelphia, PA, USA.
H. Tsai, W.-H. Liu, P.-C. Shen and W.-L. Huang, "A X-Band Fully-Integrated CMOS Power Amplifier using Current Combining Technique," 2019 IEEE 8th Global Conference on Consumer Electronics (GCCE), Osaka, Japan, 2019, pp. 411-412.
H. Wang, C. Sideris and A. Hajimiri, "A CMOS Broadband Power Amplifier With a Transformer-Based High-Order Output Matching Network," in IEEE Journal of Solid-State Circuits, vol. 45, No. 12, pp. 2709-2722, Dec. 2010.
Himanshu Sharma, Neeraj Kumar, Rajkumar Tekchandani, "Physical layer security using beamforming techniques for 5G and beyond networks: A systematic review", Elsevier, Physical Communication, vol. 54, 2022.
Hsiao-Hwa Chen, The next generation of CDMA techniques, John Wiley & Sons, 2007.
J. C. Pedro, N.B.C. Carvalho, C. Fager and J. A. Garcia, "Linearity versus efficiency in mobile handset power amplifiers: A battle without a loser", Microwave Engineering Europe, pp. 19-26, Aug. 2004.
J.-K. Wang, Y.-H. Lin, Y.-H. Hsiao, K.-S. Yeh and H. Wang, "A V-band power amplifier with transformer combining and neutralization technique in 40-nm COMS," 2017 IEEE International Symposium on Radio-Frequency Integration Technology (RFIT), Seoul, Korea (South), 2017, pp. 113-116.
J. L. Massey, "An introduction to contemporary cryptology", Proc. IEEE, vol. 76, No. 5, pp. 533-549, May 1988.
J. S. Walling, S.-M. Yoo and D. J. Allstot, "Digital power amplifier: A new way to exploit the switched-capacitor circuit," in IEEE Communications Magazine, vol. 50, No. 4, pp. 145-151, Apr. 2012.
J. Wu and J. Chen, "Multiuser transmit security beamforming in wireless multiple access channels," in Proc. IEEE Int. Conf. Commun., Ottawa, Canada, ON, Jun. 2012, pp. 903-906.

(56) References Cited

OTHER PUBLICATIONS

K. Guo, P. Huang and K. Kang, "A 60-GHz 1.2 V 21 dBm power amplifier with a fully symmetrical 8-way transformer power combiner in 90 nm CMOS", IEEE MTT-S Int. Microw. Symp. Dig., Jun. 2014.

K. Murota and K. Hirade, "GMSK Modulation for Digital Mobile Radio Telephony", IEEE Transactions on Communications, vol. 29, Issue 7, pp. 1044-1050, Jul. 1981.

Kim, J., et al., Digital predistortion of wideband signals based on power amplifier model with memory, IEEE 2001.

Kousai, S. and A. Hajimiri, "An octave-range, watt-level, fully-integrated CMOS switching power mixer array for linearization and back-off-efficiency improvement," IEEE J. Solid-State Circuits, vol. 44, No. 12, pp. 3376-3392, Dec. 2009.

L. Zhang, L.-L. Kuang, Z.-Y. Ni, and J.-H. Lu, "Performance evaluation for OFDM and SC-FDE systems with high power amplifier", Proc. IET Int. Commun. Conf. Wireless Mobile Comput. (CCWMC), Dec. 2009, pp. 348-352.

Li, Yan, et al., Design of High Efficiency Monolithic Power Amplifier With Envelope-Tracking and Transistor Resizing for Broadband Wireless Applications, IEEE Journal of Solid-State Circuits, vol. 47, No. 9, Sep. 2012.

M. Bellanger, FBMC physical layer: A primer, [in] ICT-PHYDYAS, Tech. Rep., pp. 1-31, 2010.

M. K. Simon and D. Divsalar, "A Reduced Complexity Highly Power Bandwidth Efficient Coded Feher-Patented Quadrature-Phase-Shift-Keying System with Iterative Decoding", JPL Progress report, vol. 145, No. 42, pp. 1-17, May 2001.

M. K. Simon, T. Yan, "Performance Evaluation and Interpretation of Unfiltered Feher-Patented Quadrature Phase-Shift Keying (FQPSK)", California Institute of Technology, JPL-NASA Publication, TMD Progress Report California, May 15, 1999. 42-137, Pasadena.

M. M. Assefzadeh and A. Babakhani, "Multi-order transmission line-radial stub networks for broadband impedance matching and power combining in a watt-level silicon power amplifier," 2016 Texas Symposium on Wireless and Microwave Circuits and Systems (WMCS), Waco, TX, USA, 2016, pp. 1-3.

Morgan, Dennis R., et al., A Generalized Memory Polynomial Model for Digital Predistortion of RF Power Amplifiers, IEEE Transactions on Signal Processing, vol. 54, No. 10, Oct. 2006.

N. Anand, S.-J. Lee, and E. W. Knightly, "Strobe: Actively securing wireless communications using zero-forcing beamforming," in 2012 Proceedings IEEE Infocom, Mar. 2012, pp. 720-728.

N. Benvenuto, R. Dinis, D. Falconer, and S. Tomasin, "Single carrier modulation with nonlinear frequency domain equalization: An idea whose time has come again", Proceedings of the IEEE, vol. 98, No. 1, pp. 69-96, Jan. 2010.

O. Abel Gouba, Y. Louet, "Theoretical analysis of the trade-off between efficiency and linearity of the high power amplifier in OFDM context", Proc. Eur. Wireless Conf., Apr. 2012, pp. 1-7.

O. Cepheli, T. Maslak, and G. Kurt, "Analysis on the effects of artificial noise on physical layer security," in Proc. 21st Signal Process. Commun. Appl. Conf., Haspolat, Turkey, Apr. 2013, pp. 1-4.

* cited by examiner

DECOMPOSITION OF SIGNALS INTO A SUM OF TRUNCATED FOURIER SERIES

FIELD OF THE DISCLOSURE

The present disclosure relates generally to amplifiers and more specifically to decomposition of signals into a sum of truncated Fourier series.

BACKGROUND

Energy efficiency in telecommunications systems can be a key requirement in developing these systems. For instance, modern wideband communication systems employing modulation processes having high spectral efficiencies that are characterized by high envelope fluctuations and high peak-to-average power ratio (PAPR) can compromise the power amplification efficiency of radio frequency (RF) transceivers. High PAPR can also require power amplifiers (PAs) to have higher back-off from peak, which compromises the overall energy efficiency of those PAs. This is a common problem and limitation in modern wireless communication systems that adopt these modulation processes, such as orthogonal frequency-division multiplexing (OFDM), orthogonal frequency-division multiple access (OFDMA), single carrier with frequency equalization (SC-FDE), and Synthetic Aperture Radars (SARs), all of which can be characterized by wide bandwidths and high PAPR, which can compromise amplification efficiency. The Background section of this document is provided to place embodiments of the present disclosure in technological and operational context, to assist those of skill in the art in understanding their scope and utility. Unless explicitly identified as such, no statement herein is admitted to be prior art merely by its inclusion in the Background section.

BRIEF SUMMARY OF THE DISCLOSURE

The following presents a simplified summary of the disclosure in order to provide a basic understanding to those of skill in the art. This summary is not an extensive overview of the disclosure and is not intended to identify key/critical elements of embodiments of the disclosure or to delineate the scope of the disclosure. The sole purpose of this summary is to present some concepts disclosed herein in a simplified form as a prelude to the more detailed description that is presented later.

Briefly described, embodiments of the present disclosure relate to systems and methods of performing a decomposition of signals into a sum of truncated Fourier series. According to one aspect, a method includes sampling, quantizing and mapping a baseband signal $S_{bb}(t)$ having amplitudes that assume any value within a dynamic range into a sum of time truncated periodic components. The method includes applying a sampling process having a sampling frequency $f_s=1/T_s$, where $T_s$ denotes the sampling interval duration, to obtain, for each sampling instant $t_s$, samples $S_{bbs}=S_{bb}(t_s)=A_{ks}$, where amplitude $A_{ks}$ assumes any value within a dynamic range and the number of possible values is not limited. To restrict the set of possible values of the amplitude $A_{ks}$, the method includes applying a quantization having N bits to the amplitude $A_{ks}$ to limit the set of possible values of the amplitude $A_{ks}$ to a limited alphabet having dimension of $2^N$. The method includes decomposing, by a mapper circuitry, the quantized amplitude $A_{ks}$ as a sum of N mapping components. Under these conditions after quantization based on a mapping table, the quantized magnitudes $A_{qks}$ can belong to a discrete and finite alphabet of values that are decomposed as a sum of amplitudes $A_i$ belonging to a finite alphabet $A_i \in \{A_1, \ldots, A_N\}$, where each quantized value can be represented as $$A_{qks} = \sum_{i=1}^{N} C_{I,ik} A_i,$$

where $$C_{I,ik} = \begin{cases} \pm 1 \\ 0 \end{cases}.$$

As such, through the mapping operation, the method includes decomposing each quantized amplitude $A_{qks}$ as a sum of periodic components $$s_{I,T_o}^{(i)}(t) = \sum_{n=-\infty}^{\infty} c_{I,n}^{(i)} \exp(j2\pi n f_0 t),$$

where coefficients $c_{I,n}^{(i)}$ are related to the periodic components with amplitude $A_i$. Thus, the periodic signals resulting from the combination of components are represented by $$s_{I,T_o}(t) = \sum_{i=1}^{N} C_{I,ik} s_{I,T_o}^{(i)}(t).$$

For a sampling interval $(m-1)T_s \leq t \leq mT_s$, the time truncated periodic components are represented as $$s_{Ik}^{(i)}(t) = \left[ C_{I,ik} \sum_{n=-\infty}^{\infty} c_{I,n}^{(i)} \exp(j2\pi n f_0 t) \right] r(t - mT_s).$$

And the signal components in a sampling interval are represented by the sum of a set of truncated periodic components represented by $$S_{qIk}(t) = \sum_{i=1}^{N} s_{Ik}^{(i)}(t) = \sum_{i=1}^{N} C_{I,ik} s_{I,T_o}^{(i)}(t) r(t - mT_s),$$

within a sample interval $T_s$. The quantized signal resulting from the sampling and decomposition process can be viewed as the result of a time sequence of sums of N periodic components represented by $$s_{qbbs}(t) = \sum_{m=0}^{+\infty} \left[ \sum_{i=1}^{N} s_{Ik}^{(i)}(t) \right] = \sum_{m=0}^{+\infty} S_{qIk}(t), \text{ with } f_s \geq f_0$$

and where periodic components $s_{Ik}^{(i)}(t)$ are related to the periodic component with amplitude $A_i$. A pulse shaping and spectral mask is defined by the set of Fourier coefficients $c_{I,n}^{(i)}$ related to the periodic component with amplitude $A_i$ and the shape of the pulse $r(t)$.

According to another aspect, the method can include sampling a baseline signal $$S_{bb}(t) = \sum_{k=0}^{+\infty} A_k r(t - kT)$$

having a finite set of amplitudes and mapping as a sum of truncated periodic components with amplitudes belonging to a finite alphabet with size N·r(t) is a pulse with a unitary amplitude within the symbol duration with the symbol duration being $T \leq T_0$. The method can include applying a sampling process having a sampling frequency $f_s=1/T_s$, where $T_s$ denotes the sampling interval duration, results in, for each sampling instant $t_s$, $S_{BBs}=S_{BB}(t_s)=A_{ks}$. The sample amplitude $A_{ks}$ can belong to a discrete and finite alphabet of values that can be decomposed as $$A_{ks} = \sum_{i=1}^{N} C_{I,ik} A_i$$

with amplitudes $A_i$ belonging to a finite alphabet $$A_i \in \{A_1, \ldots, A_N\} \text{ and } C_{I,ik} = \begin{cases} \pm 1 \\ 0 \end{cases}.$$

Further, each sample can be sum of the corresponding periodic components $$s_{I,T_o}^{(i)}(t) = \sum_{n=-\infty}^{\infty} c_{I,n}^{(i)} \exp(j2\pi n f_0 t),$$

where coefficients $c_{I,n}^{(i)}$ are related to the periodic components with amplitude $A_i$. The periodic signals resulting from the combination of components can be represented by $$s_{I,T_o}(t) = \sum_{i=1}^{N} C_{I,ik} s_{I,T_o}^{(i)}(t).$$

For a sampling interval $(m-1)T_s < t < mT_s$, the truncated periodic components can be represented as $$s_{Ik}^{(i)}(t) = C_{I,ik} s_{I,T_o}^{(i)}(t) r(t - mT_s).$$

For each sample interval $T_s$, the sampled baseband signal can be represented by the sum of a set of truncated periodic components $$S_{Ik}(t) = \sum_{i=1}^{N} s_{Ik}^{(i)}(t),$$

with $i=1, \ldots, N$ and $A_i \in \{A_1, \ldots, A_N\}$, and the signal resulting from the sampling and decomposition process can be represented as the result of a time sequence of sums of N time truncated periodic components represented by $$s_{bbs}(t) = \sum_{m=0}^{+\infty} \left[ \sum_{i=1}^{N} s_{Ik}^{(i)}(t) \right],$$

with periodic components $s_{Ik}^{(i)}(t)$ related to the periodic components having amplitude $A_i$.

According to another aspect, the method can include decomposing, based on a mapping operation, a baseband signal $S_{bb}(t)$ having symbols Ax that assume values within a finite set of amplitudes into a sum of N periodic components having fixed amplitudes obtained by repetition of a pulse p(t). Each symbol amplitude $A_k$ can be represented by $$A_k = \sum_{i=1}^{N} C_{I,ik} A_i$$

with where $$C_{I,ik} = \begin{cases} \pm 1 \\ 0 \end{cases}$$

and belongs to discrete and finite alphabets of values that can be decomposed as a sum of amplitudes $A_i$ belonging to a finite alphabet $A_i \in \{A_1, \ldots, A_N\}$. In each symbol duration, the baseband signal can be decomposed as sum of the corresponding periodic components $$s_{I,T_o}^{(i)}(t) = \sum_{n=-\infty}^{\infty} c_{I,n}^{(i)} \exp(j2\pi n f_0 t)$$

of amplitudes $A_i$, with the periodic signals resulting from the combination of components represented by $$s_{I,T_o}(t) = \sum_{i=1}^{N} C_{I,ik} \left[ \sum_{n=-\infty}^{\infty} c_{I,n}^{(i)} \exp(j2\pi n f_0 t) \right] = \sum_{i=1}^{N} C_{I,ik} s_{I,T_o}^{(i)}(t).$$

The coefficients $c_{I,n}^{(i)}$ can be related to the periodic components having amplitude $A_i$. Thus, for a symbol duration interval $(k-1)T < t < KT$, the truncated periodic components can be defined as $$s_{Ik}^{(i)}(t) = C_{I,ik} s_{I,T_o}^{(i)}(t) r(t - kT),$$

and the signal resulting from the sampling and decomposition process is a time sequence of sums of truncated periodic components that can be represented by $$s_{bb}(t) = \sum_{k=0}^{+\infty} \left[ \sum_{i=1}^{N} s_{Ik}^{(i)}(t) \right] = \sum_{k=0}^{+\infty} S_{Ik}(t), \text{ with } S_{Ik}(t) = \sum_{i=1}^{N} s_{Ik}^{(i)}(t).$$

Thus, a decomposition of the baseband signal can be represented as $$s_{bb}(t) = \sum_{k=0}^{+\infty} \left[ \sum_{i=1}^{N} C_{I,ik} \left[ \sum_{n=-\infty}^{\infty} c_{I,n}^{(i)} \exp(j2\pi n f_0 t) \right] \right] r(t - kT),$$

in which pulse shaping and spectral mask can be defined by the set of Fourier coefficients $c_{I,n}^{(i)}$ related to the periodic component with amplitude $A_i$ and the shape of the pulse r(t).

According to another aspect, the method can include sampling and decomposing a bandpass signal having a complex envelope $\tilde{S}(t)$ that assumes any value over a dynamic range to obtain a sum of N truncated periodic components. For each sampling instant $$t_s, \tilde{S}_s = \tilde{S}(t_s) = S_{Iks} + jS_{Qks} = E_{ks}\cos(\alpha_{ks}) + jE_{ks}\sin(\alpha_{ks}) = E_{ks}e^{j\alpha_{ks}},$$

$$\text{with } S_{Iks} = E_{ks}\cos(\alpha_{ks}) = A_{ks}, \ S_{Qks} = E_{ks}\cos(\alpha_{ks}) = B_{ks},$$

$$E_{ks} = \sqrt{S_{Iks}^2 + S_{Qks}^2} = \sqrt{A_{ks}^2 + B_{ks}^2} \text{ and } \alpha_{ks} = \arctan(S_{Qks}/S_{Iks}).$$

Since $E_{ks}$ can assume any value within dynamic range, the number of possible values of $E_{ks}$, $A_{ks}$ or $B_{ks}$ is not limited. A quantization with N bits can restrict each set of possible values of $E_{ks}$, $A_{ks}$ and $B_{ks}$, to limited alphabets with dimension of $2^N$. The method can further include decomposing, by a mapper, each quantized value as a sum of N mapping components. Under these conditions and according to a mapping table, the quantized values $$A_{qks} = \sum_{i=1}^{N} C_{I,ik} A_i \text{ with } C_{I,ik} = \begin{cases} \pm 1 \\ 0 \end{cases}$$

can belong to a discrete and finite alphabet of values that are decomposed as a sum of amplitudes $A_i$ belonging to a finite alphabet $A_i \in \{A_1, \ldots, A_N\}$, the quantized value $$B_{qks} = \sum_{i=1}^{N} C_{Q,ik} B_i$$

with $$c_{Q,ik} = \begin{cases} \pm 1 \\ 0 \end{cases}$$

can belong to a discrete and finite alphabet of values that are decomposed as a sum of amplitudes $B_i$ belonging to a finite alphabet $B_i \in \{B_1, \ldots, B_N\}$ and the quantized value $$E_{qks} = \sum_{i=1}^{N} C_{ik} E_i, \text{ with } C_{ik} = \begin{cases} \pm 1 \\ 0 \end{cases}$$

of $E_{ks}$ can be represented as a sum of N components with amplitudes $E_i$ belonging to a finite alphabet $E_i \in \{E_1, \ldots, E_N\}$.

According to another aspect, the method can include generating, by an additional quantizer, quantized representations of the quantization errors that are added to the amplitude of periodic components on a mapping operation. After a mapping operation, each quantized amplitude of the in-phase and quadrature-phase components can be decomposed as sum of the corresponding periodic components $$s_{I,T_o}^{(i)}(t) = \sum_{n=-\infty}^{\infty} c_{I,n}^{(i)} \exp(j2\pi n f_0 t)$$

and $$s_{QT_o}^{(i)}(t) = \sum_{n=-\infty}^{\infty} c_{Q,n}^{(i)} \exp(j2\pi n f_0 t),$$

where coefficients $c_{I,n}^{(i)}$ and $c_{Q,n}^{(i)}$ are related to the periodic components having respective amplitude $A_i$ and $B_i$. Thus, the periodic signals resulting from the combination of components can be represented by $$s_{I,T_o}(t) = \sum_{i=1}^{N} C_{I,ik} s_{I,T_o}^{(i)}(t) \text{ and } s_{Q,T_o}(t) = \sum_{i=1}^{N} C_{Q,ik} s_{QT_o}^{(i)}(t).$$

According to another aspect, the method can include performing a weighted sum of the quantized version of the quantization error based on the amplitudes of the periodic components. For a sampling interval $(m-1) T_s < t < mT_s$, the truncated periodic components can be represented by $$s_{Ik}^{(i)}(t) = \left[C_{I,ik} \sum_{n=-\infty}^{\infty} c_{I,n}^{(i)} \exp(j2\pi n f_0 t)\right] r(t - mT_s),$$

$$s_{Qk}^{(i)}(t) = \left[C_{Q,ik} \sum_{n=-\infty}^{\infty} c_{Q,n}^{(i)} \exp(j2\pi n f_0 t)\right] r(t - mT_s),$$

$$\text{and } s_k^{(i)}(t) = \left[C_{ik} \sum_{n=-\infty}^{\infty} c_{E,n}^{(i)} \exp(j2\pi n f_0 t)\right] e^{j\alpha_{ks}} r(t - mT_s).$$

Within a sample interval $T_s$, the quantized sampled signal can be the result of a sum of time truncated periodic components represented by $$\sum_{i=1}^{N} s_{Ik}^{(i)}(t) + j \sum_{i=1}^{N} s_{Qk}^{(i)}(t).$$

And the bandpass signal that results for each sampling interval $(m-1) T_s < t < mT_s$ can be represented by a sum of periodic truncated bandpass components as $$s_{qbps}(t) = \sum_{i=1}^{N} s_{Ik}^{(i)}(t) \cos(2\pi f_c t) - \sum_{i=1}^{N} s_{Qk}^{(i)}(t) \sin(2\pi f_c t),$$

with $s_{Ik}^{(i)}(t)$ and $s_{Qk}^{(i)}(t)$ related to the periodic components with respective amplitude $A_i$ and $B_i$. The multiplication of $s_{Ik}^{(i)}(t)$ by $\cos(2\pi f_c t)$ denoted as $s_{Ik}^{(i)\prime}(t)$ is also periodic and the same stands for the product of $s_{Qk}^{(i)}(t)$ by $\sin(2\pi f_c t)$ denoted as $S_{Qk}^{(i)\prime}(t)$, which can be represented as a Fourier series. Thus, $S_{qbps}(t)$ can be viewed as a sum of N periodic components $s_{Ik}^{(i)\prime}(t)$ and $s_{Qk}^{(i)\prime}(t)$ represented by $$s_{qbps}(t) = \sum_{k=0}^{+\infty} s_{Ik}^{(i)\prime}(t) - \sum_{k=0}^{+\infty} s_{Qk}^{(i)\prime}(t).$$

According to another aspect, the method can include decomposing a bandpass signal having a complex envelope $\tilde{S}(t)$ with a finite set of amplitudes as a sum of N truncated periodic components. Assuming a unitary amplitude for the pulse $r(t)$, in a symbol interval $(k-1) T < t < kT$, this bandpass signal can be represented by $$S_{bp}(t) = E_k \cos(\alpha_k)\cos(2\pi f_c t) - E_k \sin(\alpha_k)\sin(2\pi f_c t) = E_k \cos(2\pi f_c t + \alpha_k),$$

where $$S_{Ik} = A_k = E_k\cos(\alpha_k) \text{ and } S_{Qk} = B_k = E_k\sin(\alpha_k), \alpha_k = \arctan(S_{Qk}/S_{Ik})$$

belongs to a finite alphabet and $$E_k = \sqrt{S_{Ik}^2 + S_{Qk}^2}.$$

Through a mapping process, the method can include decomposing the amplitude $A_k$ values as a sum of amplitudes $A_i$ belonging to a finite alphabet $A_i \in \{A_1, \ldots, A_N\}$, $B_k$ values are decomposed as a sum of amplitudes $B_i$ belonging to a finite alphabet $B_i \in \{B_1, \ldots, B_N\}$ and $E_x$ values are decomposed as a sum of amplitudes $B_i$ belonging to a finite alphabet $E_i \in \{E_1, \ldots, E_N\}$. Therefore, the in-phase and quadrature-phase components can be decomposed as sum of the corresponding periodic components $$s_{I,T_o}^{(i)}(t) = \sum_{n=-\infty}^{\infty} c_{I,n}^{(i)} \exp(j2\pi n f_0 t)$$

of amplitudes $A_i$ and periodic components $$s_{QT_o}^{(i)}(t) = \sum_{n=-\infty}^{\infty} c_{Q,n}^{(i)} \exp(j2\pi n f_0 t)$$

of amplitudes $B_i$, with the periodic signals resulting from the combination of components represented by $$s_{I,T_o}(t) = \sum_{i=1}^{N} C_{I,ik}\left[\sum_{n=-\infty}^{\infty} c_{I,n}^{(i)}\exp(j2\pi nf_0 t)\right] = \sum_{i=1}^{N} C_{I,ik} s_{I,T_o}^{(i)}(t) \text{ and } s_{Q,T_o}(t) =$$
$$\sum_{i=1}^{N} C_{Q,ik}\left[\sum_{n=-\infty}^{\infty} c_{Q,n}^{(i)}\exp(j2\pi nf_0 t)\right] = \sum_{i=1}^{N} C_{Q,ik} s_{QT_o}^{(i)}(t).$$

Coefficients $c_{I,n}^{(i)}$ and $c_{Q,n}^{(i)}$ are related to the periodic components with respective amplitudes $A_i$ and $B_i$. For a symbol duration interval $(k-1)T < t < kT$, the in-phase and quadrature-phase components in a symbol duration interval T can be represented by a sum of truncated periodic components $$S_{Ik}(t) = \sum_{i=1}^{N} s_{Ik}^{(i)}(t) = \sum_{i=1}^{N} C_{I,ik} s_{I,T_o}^{(i)}(t) r(t-kT),$$
$$\text{and } S_{Qk}(t) = \sum_{i=1}^{N} s_{Qk}^{(i)}(t) = \sum_{i=1}^{N} C_{Q,ik} s_{Q,T_o}^{(i)}(t) r(t-kT),$$

and for each symbol interval $(k-1) T < t < kT$, the bandpass signal can be represented as a sum of N time truncated periodic bandpass components by $$s_{bp}(t) = \sum_{k=0}^{+\infty}\sum_{i=1}^{N} s_{Qk}^{(i)}(t)\cos(2\pi f_c t) - \sum_{k=0}^{+\infty}\sum_{i=1}^{N} s_{Qk}^{(i)}(t)\sin(2\pi f_c' t).$$

Since $S_{I,T_o}(t)$, and $s_{Q,T_o}(t)$ are periodic, the product of $S_{I,T_o}(t)$ by $\cos(2\pi f_c t)$ is also periodic locally and the same stands for the product of $S_{Q,T_o}(t)$ by $\sin(2\pi f_c t)$, which can be represented as a time truncated Fourier series.

According to another aspect, the method can include generating truncated periodic bandpass components at an intermediate frequency $f_i$ and posteriorly up-converting to the carrier frequency $f_c$.

According to another aspect, the method can include receiving a clock signal associated with a sampling frequency $f_s$ of the baseband input signal, a clock signal associated with an intermediate frequency $f_i$, and a clock signal associated with a carrier frequency $f_c$.

According to another aspect, the method can include receiving and sampling a baseband signal based on a reference clock signal associated with a sampling rate.

According to another aspect, the method can include amplifying the set of truncated periodic components and then combining the set of truncated periodic components to obtain an output signal.

According to another aspect, the method can include amplifying the truncated periodic bandpass components and then combining the set of truncated periodic bandpass components to obtain an output signal.

According to another aspect, the method can include generating the set of truncated periodic bandpass components at an intermediate frequency fi and up-converting to an RF carrier frequency before being amplified and combined.

According to another aspect, the method can include amplifying each truncated periodic component or each truncated periodic bandpass component for output to a transducer.

BRIEF DESCRIPTION OF THE DRAWINGS

The present disclosure will now be described more fully hereinafter with reference to the accompanying drawings, in which embodiments of the disclosure are shown. However, this disclosure should not be construed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION

Figure 1:
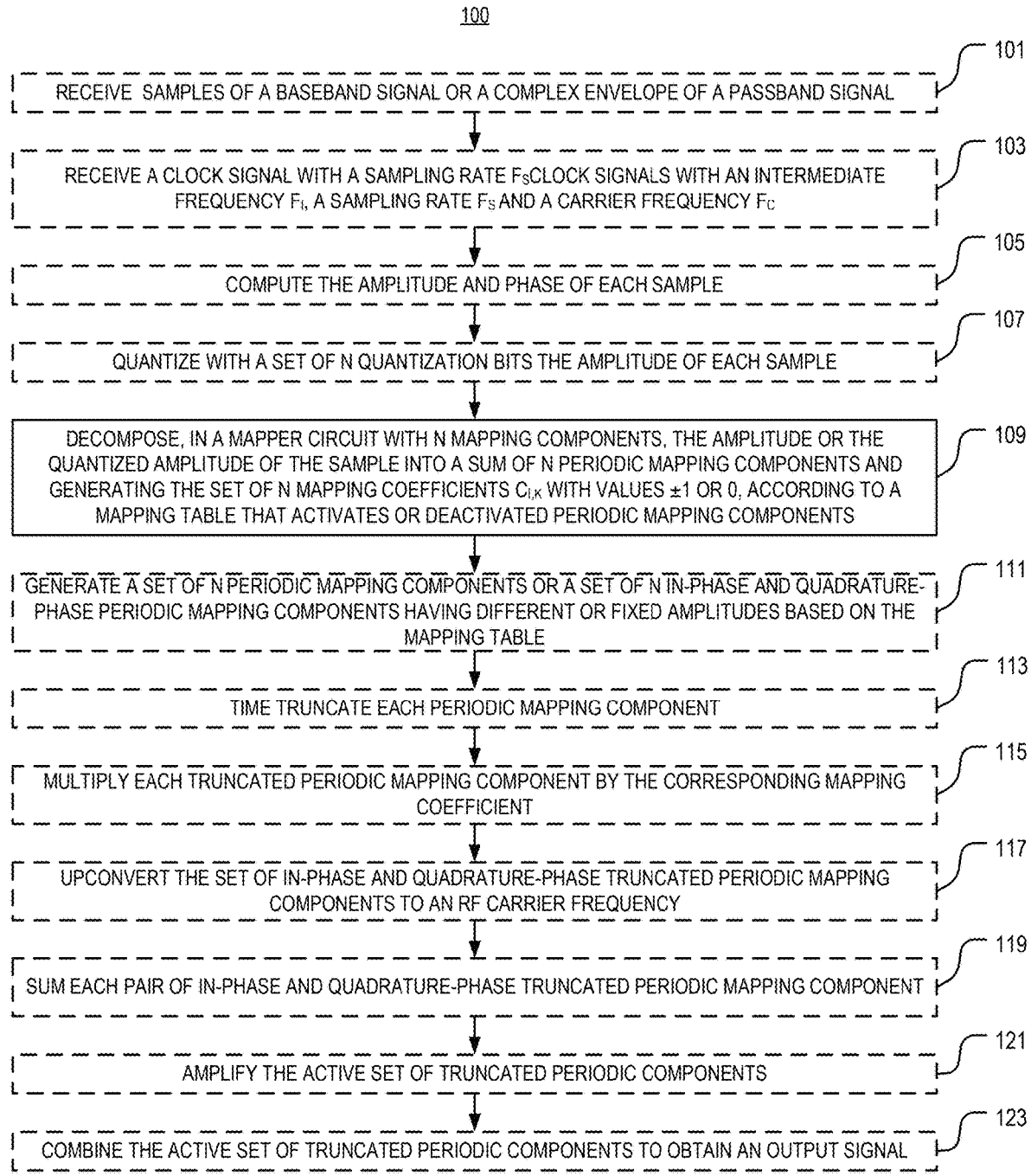
FIG. 1 illustrates one embodiment of a method of performing a decomposition of signals into a sum of truncated baseband signals in accordance with various aspects as described herein.

For simplicity and illustrative purposes, the present disclosure is described by referring mainly to an exemplary embodiment thereof. In the following description, numerous specific details are set forth in order to provide a thorough understanding of the present disclosure. However, it will be readily apparent to one of ordinary skill in the art that the present disclosure may be practiced without limitation to these specific details.

In this disclosure, systems and methods of performing a decomposition of signals into a sum of truncated Fourier series are provided. Signals used in telecommunication systems can include periodic signals whose characteristics can change according to the transmitted information symbols, leading to signals having changes in amplitude, phase or the like over time. Signals in modern communication systems can include changes of amplitude and phase related to the carried information and these changes can cause envelope variations over time that can increase transceiver complexity such as related to amplification and mapping of the transmitted signals. These signals can be represented as periodic signals that can suffer changes to amplitude and phase according to the information carried in each symbol interval. A periodic signal $s_{T_0}(t)$ with period $T_0$ obtained by repetition of a pulse $$p(t)s_{T_o}(t) = \sum_{n=-\infty}^{\infty} A\ p(t-nT_0),$$

with p(t) being a pulse with a duration $T \le T_0$ can be represented as a Fourier series represented by $$s_{T_o}(t) = a_0 + 2\sum_{n=1}^{\infty} [a_n\cos(2\pi n f_0 t) + b_n\sin(2\pi n f_0 t)],$$

with $f_0$ denoting the fundamental frequency $$f_0 = \frac{1}{T_0}.$$

The coefficients $a_n$ and $b_n$ represent the amplitudes of the respective cosine and sine terms. The coefficients $a_0$, $a_n$ and $b_n$ are given as a function of the periodic signal $s_{T_o}(t)$, by $a_n = \frac{1}{T_0}\int_{-T_0/2}^{T_0/2} s_{T_o}(t)\cos(2\pi n f_0 t)dt,$ $$b_n = \frac{1}{T_0}\int_{-T_0/2}^{T_0/2} s_{T_o}(t)\sin(2\pi n f_0 t)dt,$$

with n=1, 2, ..., ∞, and $$a_0 = \frac{1}{T_0}\int_{-T_0/2}^{T_0/2} s_{T_o}(t)dt.$$

Periodic signals can be also represented as a complex exponential Fourier series represented by $$s_{T_o}(t) = \sum_{n=-\infty}^{\infty} c_n \exp(j2\pi n f_0 t),$$

with $$c_n = f_0 \int_{-\infty}^{+\infty} s_{T_o}(t)\exp(-j2\pi n f_0 t)dt.$$

With the amplitude A decomposed as a sum of N components with amplitudes $A_i \in \{A_1, \ldots, A_N\}$, any periodic signal resulting from a sum of N periodic signals $$\sum_{i=1}^{N} s_{T_0}^{(i)}(t) = \sum_{i=1}^{N}\sum_{n=-\infty}^{\infty} A_i p(t-nT_0)$$

with amplitudes $A_i$ can be expressed as a sum of N Fourier series $$\sum_{i=1}^{N}\sum_{n=-\infty}^{\infty} c_n^{(i)}$$

$\exp(j2\pi n f_0 t)$, in which $c_n^{(i)}$ represents the Fourier coefficients associated with the i-th periodic signal component with amplitude $A_i$. A baseband signal represented by $$S_{bb}(t) = \sum_{k=0}^{+\infty} A_k r(t-kT),$$

where $A_k$ has a finite set of amplitudes, can be mapped as a sum of time truncated periodic components with amplitudes belonging to a finite alphabet with size N, in which each $A_k$ is decomposed. Also, baseband or bandpass signals with continuous values over a dynamic range may have a similar decomposition in terms of periodic components, after a quantization that restricts the alphabet size of possible values that are expressed as sums of components with fixed amplitudes.

In one embodiment, a system can generate a set of periodic components with fixed amplitudes that are time truncated and used to represent the sampled signals as a sum of fixed or constant envelope components, with the spectral mask defined by the Fourier coefficients and the pulse employed in the time truncation operation. The system can sample and decompose continuous and discrete baseband or bandpass signals as a sum of truncated periodic components, which increases flexibility to represent a wider range of signal formats and constellations. The system can quantize the signals to obtain a finite set of possible values that are decomposed as a sum of time truncated periodic components. The system does not have to quantize those signals that assume values in a discrete alphabet, since the values of the alphabet can also be decomposed as a sum of time truncated periodic components having fixed amplitudes.

FIG. 1 illustrates one embodiment of a method 100 of performing a decomposition of signals into a sum of truncated baseband signals in accordance with various aspects as described herein. In FIG. 1, the method 100 can start, for instance, at block 101 where it can include receiving samples of a baseband signal or the samples of a complex envelope or envelope of a bandpass signal. For example, the method 100 can include sampling, by a sampling circuitry or a sample and hold (S/H) circuitry, a baseband signal to generate the samples of the input signal. At block 103, the method 100 can include receiving a clock signal associated with a sample rate $f_s$ of the input signal, a clock signal associated with a sample rate $f_s$ of the input signal, a clock signal associated with an intermediate frequency $f_i$, a clock signal associated with a carrier frequency $f_c$, or the like. A skilled artisan will recognize that a sample rate can vary according to the bandwidth of an input signal or the desired time resolution of the sampling process. At block 105, the method 100 can include computing the amplitude or the phase of each sample. At block 107, the method 100 can include quantizing each sample amplitude based on N quantization bits. At block 109, the method 100 includes decomposing, by a mapper circuitry associated with N mapping components, the amplitude or the quantized amplitude of the sample into a sum of N amplitude values and generating a set of N mapping coefficients based on a mapping table that activates or deactivates the set of N mapping components. Further, the number of mapping components can be equal to the number of the set of quantization amplitude bits of the sample. At block 111, the method 100 can include generating a set of N periodic mapping components or a set of N in-phase and quadrature-phase periodic mapping components having different or fixed amplitudes based on the mapping table. At block 113, the method 100 can include time truncating each periodic mapping component. At block 115, the method 100 can include multiplying each truncated periodic mapping component by the corresponding mapping coefficient. At block 117, the method 100 can include upconverting the set of in-phase and quadrature-phase truncated periodic mapping components to carrier frequency $f_c$. At block 119, the method 100 can include summing each pair of in-phase and quadrature-phase truncated periodic mapping components. In another embodiment steps 107-op1 and 107-op2 convert truncated periodic mapping components to an intermediate frequency and an up conversion to the carrier frequency is needed. At block 121, the method 100 can include amplifying, by a set of power amplifiers, the active set of truncated periodic components. At block 123, the method 100 can include combining the active set of truncated periodic components to obtain an output signal.

In another embodiment, the method can compute a quantization amplitude error $e_q$ as the difference between the amplitude $A_n$ and the quantized amplitude $A_{nq}$ and can quantize the quantization amplitude error $e_q$ to obtain a quantized quantization amplitude error ego that can be input to the mapper circuitry operable to perform a weighted compensation of the quantization amplitude error $e_q$ on at least one of the active set of truncated periodic mapping components.

In another embodiment, the method can include computing the quantization amplitude error $e_q$ and quantizing the quantization amplitude error $e_q$ to obtain quantized quantization amplitude error $e_{qQ}$ that can be applied to method step 111 to perform a weighted compensation of the quantized quantization amplitude error ego on at least one of the amplitudes of the set of periodic mapping components.

In another embodiment, the method steps of quantizing, mapping, periodic component generating, time truncating and generating mapping coefficients that activate or deactivate the set of truncated periodic components can be performed in a single digital block.

Figure 2A:
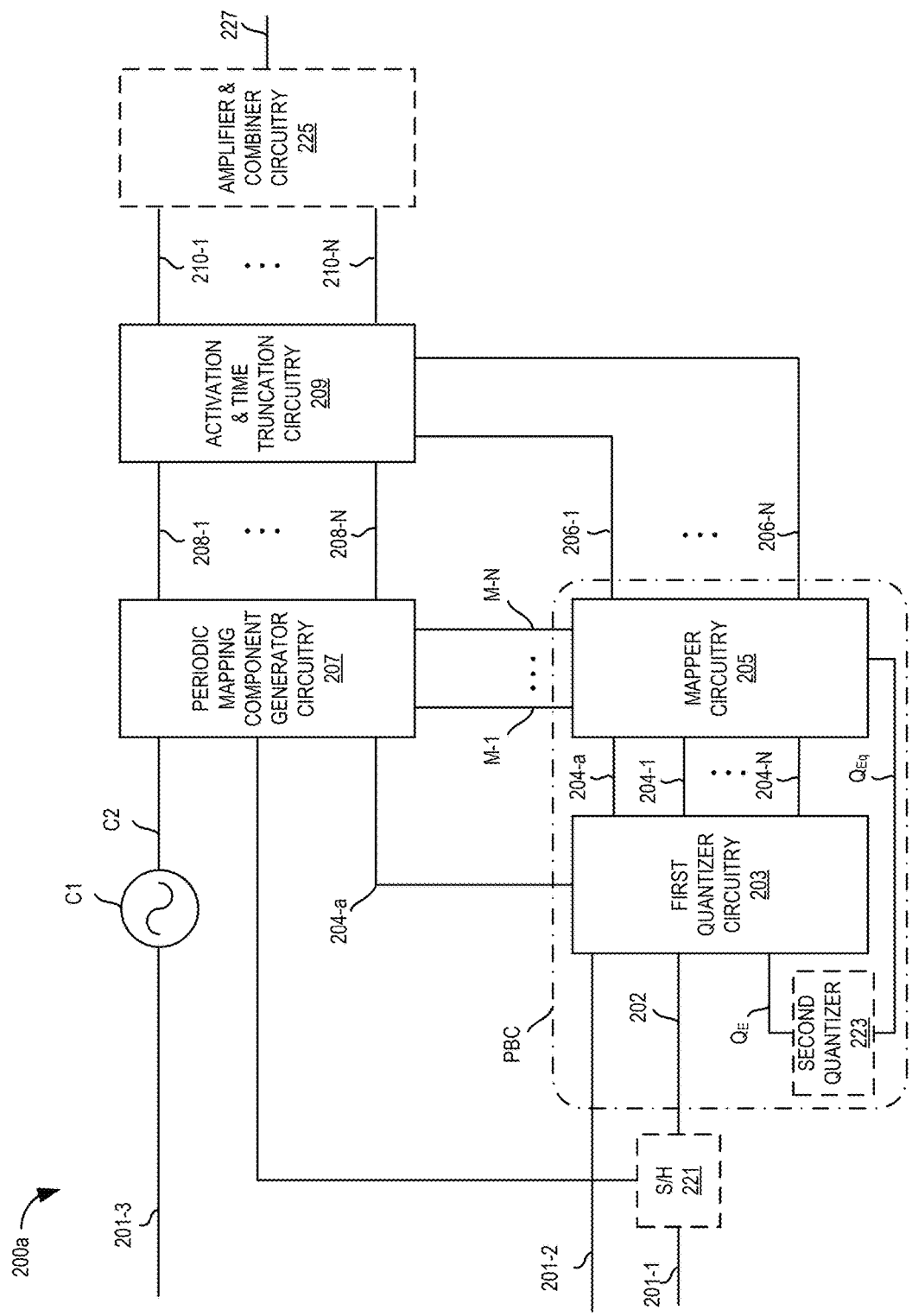
FIGS. 2A-2B illustrate embodiments of a system of performing a decomposition into a sum of truncated baseband signals assuming values over a dynamic range in accordance with various aspects as described herein.
Figure 2B:
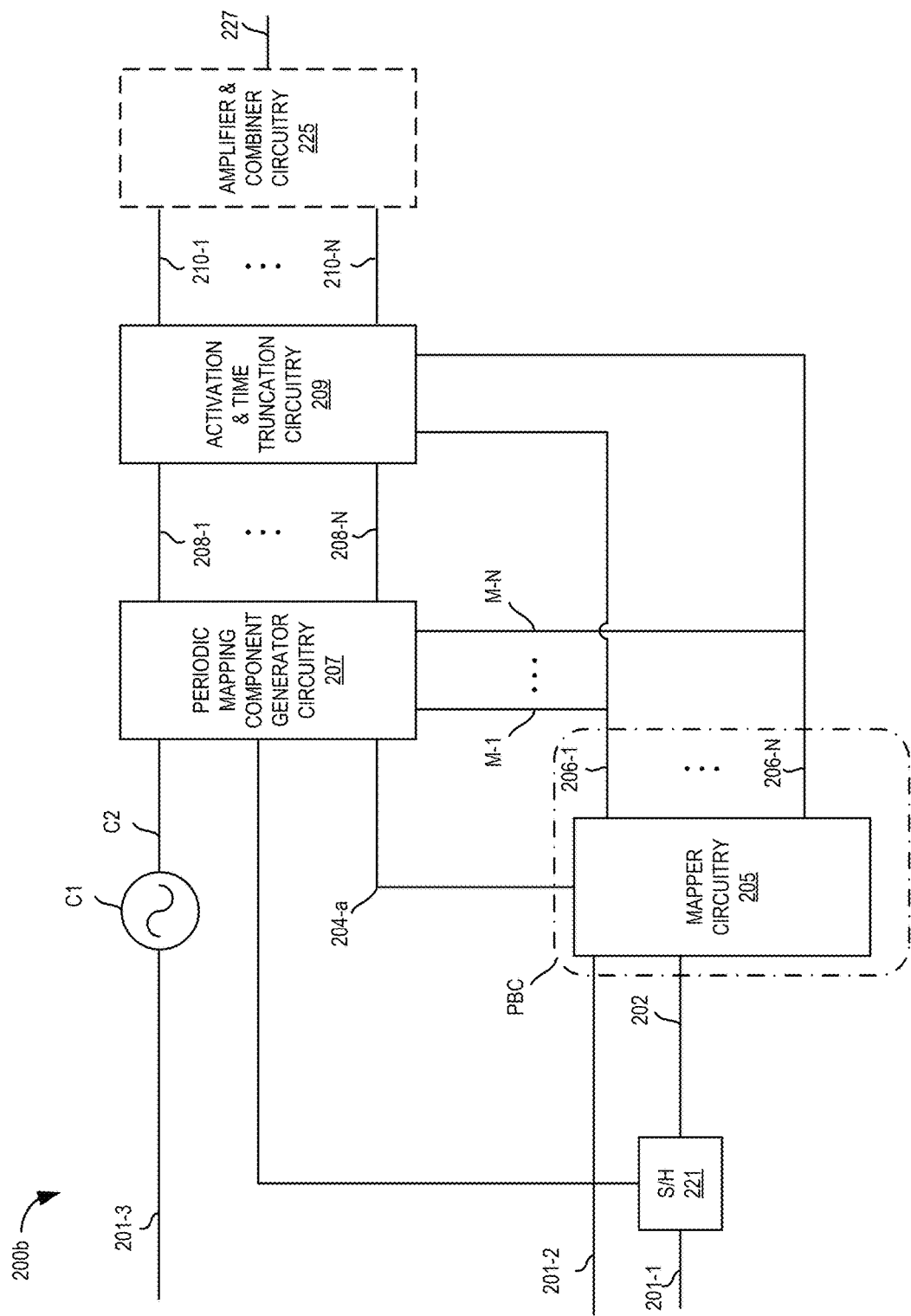

FIGS. 2A-2B illustrate embodiments of a system 200*a,b* of performing a decomposition into a sum of truncated baseband signals assuming values over a dynamic range in accordance with various aspects as described herein. The system 200*a,b* can include a sampling circuitry or a sample and hold circuitry 221 operable to receive an input signal 201-1 (e.g., baseband or bandpass signal), a sample 202 of the input signal 201-1 or samples of the complex envelope of the input signal 201-1, a set of reference clock signals, or the like. A first quantizer circuitry 203 and a mapper circuitry 205, represented by a processing block circuitry PBC, can be operable to receive each sample 202 and compute an amplitude or a phase of each sample. The first quantizer circuitry 203 can be operable to limit the input signal 201-1 from assuming values over a dynamic range to a finite alphabet of possible values of the samples 202. Further, a second quantizer circuitry 223 can be operable to quantize a quantization amplitude error $e_q$ to obtain a quantized quantization amplitude error $e_{qQ}$. The mapper circuitry 205 can be further operable to decompose the sample as a sum of a set of periodic mapping components and generate a set of mapping coefficients based on a mapping table that activates or deactivates the set of periodic mapping components. After the mapper circuitry 205, a periodic mapping component generator circuitry 207 can be operable to generate a set of periodic mapping components based on a set of mapping coefficients and a mapping table. A time truncation circuitry 209 can be operable to time truncate each periodic mapping component to a certain time duration and can multiply each truncated periodic mapping component by the corresponding mapping coefficients. An amplifier and combiner circuitry 225 can include an upconverter circuitry operable to up-convert a signal, a set of Digital to Analog Converters (DACs) operable to convert a digital signal to an analog signal, a set of mixer circuitry operable to mix a signal, a set of power DACs or power amplifiers operable to amplify the active set of bandpass truncated periodic components, combiner circuitry operable to combine signals, matching network circuitry, transducer circuitry, or the like.

In FIG. 2A, the system 200*a* can receive the input signal 201-1 such as the time samples $S_{bbs}$ of a baseband signal $S_{bb}(t)$, with amplitudes assuming any value within a dynamic range. In one example, the sampling circuitry or the sample and hold circuitry 221 can sample the input signal 201-1 to obtain the samples 202 with $f_s \geq f_0$. In another example, the input signal 201-1 can include the samples $S_{bbs}$ $(t_s)=S_{bbs}=A_{ks}$ of a baseband signal. The system 200*a* can receive a clock reference signal 201-2 associated with a sampling frequency, a reference signal clock 201-3 associated with an intermediate frequency $f_i$, a clock signal 201-4 associated with a carrier frequency $f_c$, a clock signal 201-5 associated with a fundamental frequency of the periodic components. A skilled artisan will recognize that the selection of the clock reference signals can be performed based on the bandwidth of an input signal or the desired frequency of the input signal. The system 200*a* can be configured to input the clock signal 201-2 associated with the sampling frequency to the sampling block 221, the quantizer circuitry 203, the mapper circuitry 205, the time truncation circuitry 209, the amplifier and combiner circuitry 225, or the like. The input signal 201-3 can include a clock reference associated with a fundamental frequency for the periodic components in which each sample is decomposed.

In FIG. 2A, the processing block circuitry PBC includes the first quantizer circuitry 203 and the mapper circuitry 205 operable to compute the amplitude $A_{ks}$ and the phase of each sample. The first quantizer circuitry 203 can quantize the amplitude $A_{ks}$ using N bits so as to limit the set of possible values of the amplitude $A_{ks}$ to limited alphabets having a dimension of $2^N$ values. The corresponding set of quantization bits 204-$\{1, \ldots, N\}$ and the signal 204-$a$ representing the quantized values of the quantized amplitude $A_{qks}$ can be input to the mapper circuitry 205. The mapper circuitry 205 can decompose, based on a mapping table, the quantized amplitude $A_{qks}$ as a sum $$A_{qks} = \sum_{i=1}^{N} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, \ldots, A_N\}$ and related to periodic components with same amplitude. The mapper circuitry 205 can compute the set of N mapping coefficients $C_{I,ik}$ which are output via signals 206-$\{1, \ldots, N\}$ to the activation and time truncation block circuitry 209 operable to activate/deactivate and truncate the set of periodic components. The mapper circuitry 205 can also provide via the signal 206-$a$ the finite alphabet $A_i \in \{A_1, \ldots, A_N\}$ to the periodic mapping component generator circuitry 207 operable to generate the set of periodic components 208-$\{1, \ldots, N\}$ in which each quantized amplitude is decomposed, represented by $$s_{I,T_o}^{(i)}(t) = \sum_{n=-\infty}^{\infty} c_{I,n}^{(i)} \exp(j2\pi n f_0 t),$$

where coefficients $c_{I,n}^{(i)}$ are related to the periodic mapping components with amplitude $A_i$. The mapper circuitry 205 can also output, to the periodic mapping component generator circuitry 207, a set of signals M-$\{1, \ldots, N\}$ having information associated with the quantization parameters and the mapping coefficients.

In another embodiment, the second quantizer circuitry 223 can receive, from the first quantizer circuitry 203, the quantization error $e_q$ and can quantize the quantization error $e_q$ to the quantized quantization error ego. The second quantizer 223 can then output, to the mapper circuitry 205, the quantized quantization error $e_{qQ}$.

In FIG. 2A, the activation and time truncation circuitry 209 can activate and time truncate, based on the coefficients $C_{I,ik}$ obtained via signals 206-$\{1, \ldots, N\}$, the sampling pulse duration $T_s$, the pulse r(t) or the like, the set of periodic components 208-$\{1, \ldots, N\}$ and can generate the set of N truncated periodic components 210-$\{1, \ldots, N\}$ of these signals represented by $$s_{Ik}^{(i)}(t) = [C_{I,ik} s_{I,T_o}^{(i)}(t)] r(t - mT_s).$$

The activation and time truncation circuitry 209 can output, to the amplifier and combiner circuitry 225, the active set of truncated mapping components 210-$\{1, \ldots, N\}$. The circuitry 225 can include a combiner circuitry operable to combines the active set of truncated periodic components to generate, for each sample interval $T_s$, a sum of the active set of truncated periodic components $$S_{qIk}(t) = \sum_{i=1}^{N} s_{Ik}^{(i)}(t)$$

as the output signal 227. The sum of N periodic components can be represented by $$s_{qbbs}(t) = \sum_{m=0}^{+\infty} \left[ \sum_{i=1}^{N} s_{Ik}^{(i)}(t) \right] = \sum_{m=0}^{+\infty} S_{qIk}(t),$$

where the truncated periodic components $s_{Ik}^{(i)}(t)$ are related to the periodic components with amplitude $A_i$.

In another embodiment, both the first quantizer circuitry 203 and the mapper circuitry 205 can be configured to include a look up table (LUT) circuitry configured to include different quantization and mapping rules to generate different sets of periodic mapping components associated with different baseband signals.

In another embodiment, the first quantizer circuitry 203, the mapper circuitry 205 and the periodic mapping component generator circuitry 207 can be implemented in a single analog or digital circuitry block.

In another embodiment, the amplifier and combiner circuitry 225 can include a set of N power amplifiers operable to amplify each truncated periodic component and a combining circuitry to generate, for each sampling interval, the output signal 227. The combined and amplified output signal 227 can be represented by $$s_{qbbs}(t) = \sum_{i=1}^{N} g_a^i C_{I,ik} \left[ \sum_{n=-\infty}^{\infty} c_{I,n}^{(i)} \exp(j2\pi n f_0 t) \right] = \sum_{m=0}^{+\infty} \left[ \sum_{i=1}^{N} g_a^i s_{Ik}^{(i)}(t) \right],$$

with $g_a^i$ denoting the gain of amplifier associated with periodic component with amplitude $A_i$.

In another embodiment, the amplifier and combiner circuitry 225 can include a set of N power amplifiers electrically coupled to a set of transducers.

In FIG. 2B, the processing block circuitry PBC includes the mapper circuitry 205 operable to compute the amplitude $A_{ks}$ of each sample, and decompose the amplitude $A_{ks}$ based on a mapping table as a sum $$A_{ks} = \sum_{i=1}^{N} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, \ldots, A_N\}$ related to periodic components having the same amplitude. The mapper circuitry 205 can compute the set of N pairs of coefficients $C_{I,ik}$, which are output via signals 206-$\{1, \ldots, N\}$ to the periodic mapping component generator circuitry 207 operable to activate/deactivate and truncate the set of periodic mapping components. The mapper circuitry 205 can also output, to the periodic mapping component generator circuitry 207, the signal 204-$a$ that includes the finite alphabets $A_i \in \{A_1, \ldots, A_N\}$ to generate the set of periodic mapping components 208-$\{1, \ldots, N\}$ represented by $$s_{I,T_o}^{(i)}(t) = \sum_{n=-\infty}^{\infty} c_{I,n}^{(i)} \exp(j2\pi n f_0 t),$$

where coefficients $c_{I,n}^{(i)}$ are related to the periodic components with amplitude $A_i$. The activation and time truncation circuitry 207 can activate/deactivate and time truncate, based on the coefficients $C_{I,ik}$ obtained via the signals 206-{1, ..., N}, the sampling pulse duration $T_s$ and the pulse r(t), the set of periodic mapping components 208-{1, ..., N} and can generate the set of N truncated components 210-{1, ..., N} represented by $$s_{Ik}^{(i)}(t) = \left[C_{I,ik}s_{I,T_o}^{(i)}(t)\right]r(t-mT_s).$$

In another embodiment, the activation and time truncation circuitry 209 can activate/deactivate and time truncate, based on the coefficients $C_{ik}$ from 206-{1, ..., N} together the sampling pulse duration $T_s$ and pulse r(t) to activate and time truncate periodic components 208-{1, ..., N} and generate the set of N truncated periodic components 210-{1, ..., N} represented by $$s_{Ik}^{(i)}(t) = \left[C_{I,ik}s_{T_o}^{(i)}(t)\right]e^{j\alpha_{ks}}r(t-mT_s).$$

Active truncated periodic components among the possible ones 210-{1, ..., N} are the input of an optional block op1.

In FIG. 2B, the amplifier and combiner circuitry 225 can include a combiner circuitry operable to combine the set of truncated periodic components to generate, for each sample interval $T_s$, the sum of the set of truncated periodic components represented by $$S_{qIk}(t) = \sum_{i=1}^{N} s_{Ik}^{(i)}(t),$$

to obtain the output signal 227. The output signal 227 can be represented as a sequence of sums of N periodic components given by $$s_{bbs}(t) = \sum_{m=0}^{+\infty}\left[\sum_{i=1}^{N} s_{Ik}^{(i)}(t)\right],$$

where the truncated periodic components $s_{Ik}^{(i)}(t)$ are related to the periodic components with amplitude $A_i$, which are the sampled symbol of order k in the sequence of symbols of the input signal.

In another embodiment, the amplifier and combiner circuitry 225 can include a set of N power amplifiers operable to amplify each truncated periodic component and a combining circuitry operable to combine, for each sampling interval, the set of amplified truncated periodic components to obtain the output signal 227 represented by $$s_{qbbs}(t) = \sum_{i=1}^{N} g_a^i C_{I,ik}\left[\sum_{n=-\infty}^{\infty} c_{I,n}^{(i)}\exp(j2\pi nf_0 t)\right] = \sum_{m=0}^{+\infty}\left[\sum_{i=1}^{N} g_a^i s_{Ik}(t)\right],$$

with $g_a^i$ denoting the gain of amplifier associated with periodic component with amplitude $A_i$.

In another embodiment, the amplifier and combiner circuitry 225 can include a set of N power amplifiers electrically coupled to a set of transducers.

In another embodiment, the system 200b can receive the input signal 201-1 that includes the sequence of symbols of a baseband signal $$S_{bb}(t) = \sum_{k=0}^{+\infty} A_k r(t-kT),$$

where the symbols $A_k$ assume discrete values over a finite alphabet that is decomposed as a sum of N truncated periodic components obtained by repetition of a pulse p(t) with fixed amplitudes. Each symbol, $A_k$ is represented by $$A_k = \sum_{i=1}^{N} C_{I,ik} A_i$$

with where $$C_{I,ik} = \begin{cases} \pm 1 \\ 0 \end{cases}$$

and belongs to discrete and finite alphabets of values that can be decomposed as a sum of amplitudes $A_i$ belonging to a finite alphabet $A_i \in \{A_1, ..., A_N\}$. The mapper circuitry 205 can decompose the amplitude $A_k$ based on a mapping table as a sum $$A_k \sum_{i=1}^{N} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, ..., A_N\}$, which are related to periodic components with the same amplitude. The mapper circuitry 205 can also compute the set of N coefficients $C_{I,ik}$, which are output to the activation and time truncation circuitry 209 via the signals 206-{1, ..., N}. The mapper circuitry 205 can also output to the periodic mapping component generator circuitry 207 via the signal 204-a the finite alphabets $A_i \in \{A_1, ..., A_N\}$ to generate the periodic components 205-{1, ..., N} represented by $s_{I,T_0}^{(i)}(t)=$ $$\sum_{n=-\infty}^{\infty} c_{I,n}^{(i)} \exp(j2\pi nf_0 t),$$

where coefficients $c_{I,n}^{(i)}$ are related to the periodic mapping components with amplitude $A_i$. The activation and time truncation circuitry 209 can activate/deactivate and time truncate, based on the coefficients $C_{I,ik}$ obtained via the signals 206-{1, ..., N} and the sampling pulse duration $T_s$ and pulse r(t), the set of periodic mapping components 208-{1, ..., N} to obtain the set of N truncated periodic components 210-{1, ..., N} represented by $$s_{Ik}^{(i)}(t) = \left[C_{I,ik} s_{I,T_o}^{(i)}(t)\right] r(t-mT_s).$$

In FIGS. 2A and 2B, the mapping tables, the quantization and mapping rules can be stored in one or more LUT circuitry and the quantizer circuitry 203, mapper circuitry 205 or the generator circuitry 207 can be implemented in a single analog or digital circuitry block.

Figure 3:
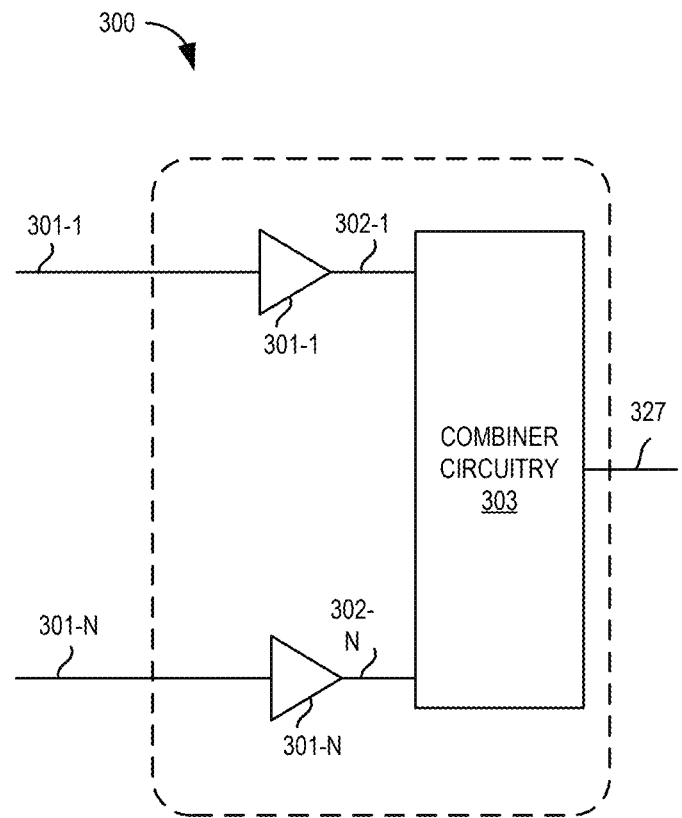
FIG. 3 illustrates one embodiment of a system of amplifying and combining a set of truncated bandpass signals in accordance with various aspects as described herein.

FIG. 3 illustrates one embodiment of a system 300 of amplifying and combining a set of truncated bandpass signals in accordance with various aspects as described herein. In FIG. 3, the system 300 represents one embodiment of the amplifier and combiner circuitry 225 of FIGS. 2A and 2B. In FIG. 3, the system 300 can include a set of amplifiers 301-{1, ..., N} and a combiner circuitry 303. The set of amplifiers 301-{1, ..., N} can receive an active set of truncated periodic components 301-{1, ..., N}, which correspond to the signals 210-{1, ..., $N_{=b}$} in FIGS. 2A and 2B, and can amplify the active set of truncated periodic components 301-{1, ..., N} to obtain an active set of amplified truncated periodic components 302-{1, ..., N}, represented by $g_a^i s'{}_k^{(i)}$, where $g_a^i$ denotes the amplifier gain of the amplifier associated with the $i^{th}$ component. The combiner circuitry 327 can combine the active set of amplified truncated periodic components 302-{1, ..., N} to obtain the output signal 372, which represents the sum of the active set of N'≤N truncated periodic mapping components.

In another embodiment, the combiner circuitry 303 can include a set of combiners or a matching network.

In another embodiment, the combiner circuitry 303 can include a set of transducers.

Figure 4A:
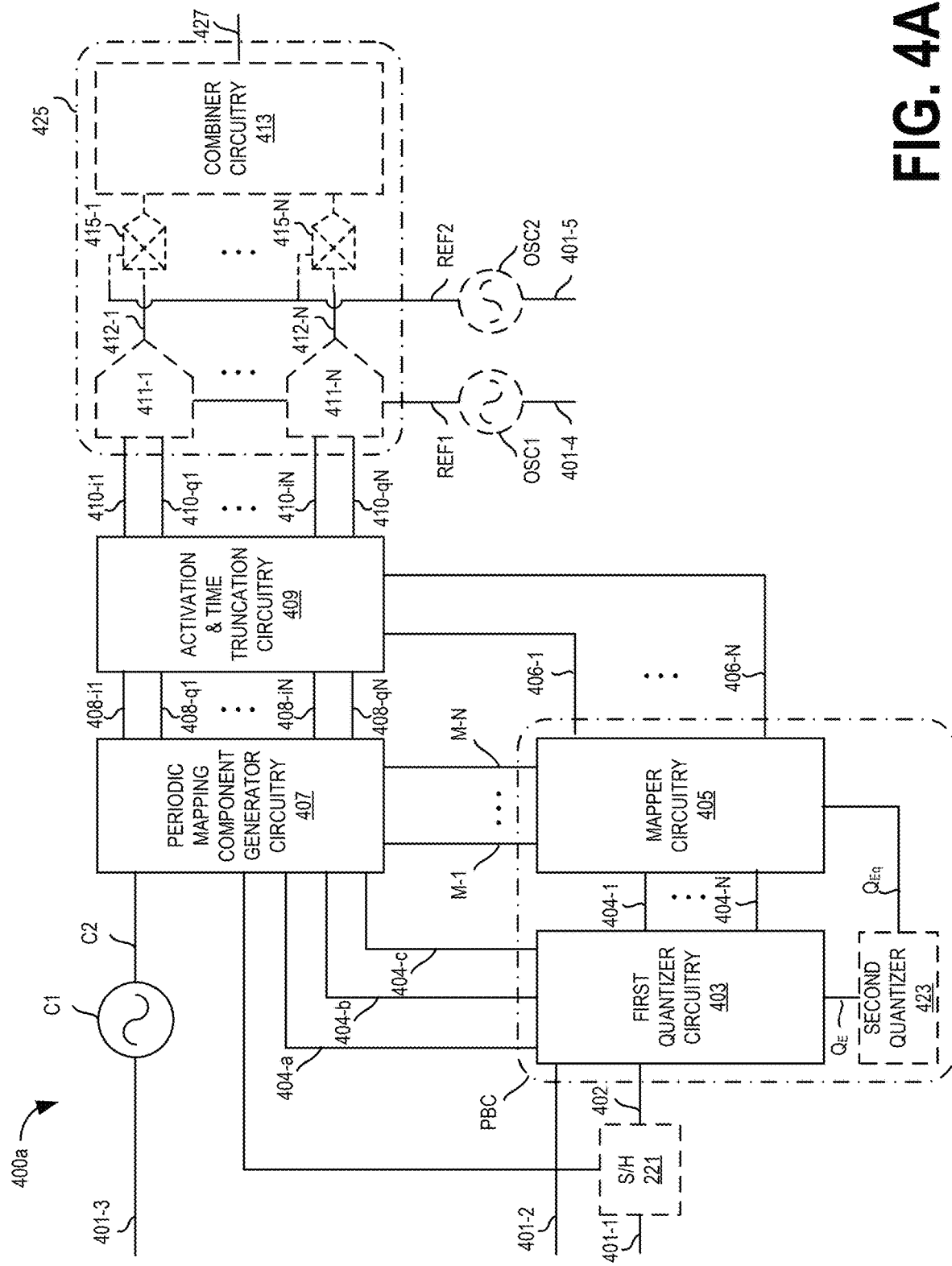
FIGS. 4A-4B illustrate embodiments of a system of performing a decomposition into a sum of a limited set of truncated bandpass signals in accordance with various aspects as described herein.
Figure 4B:
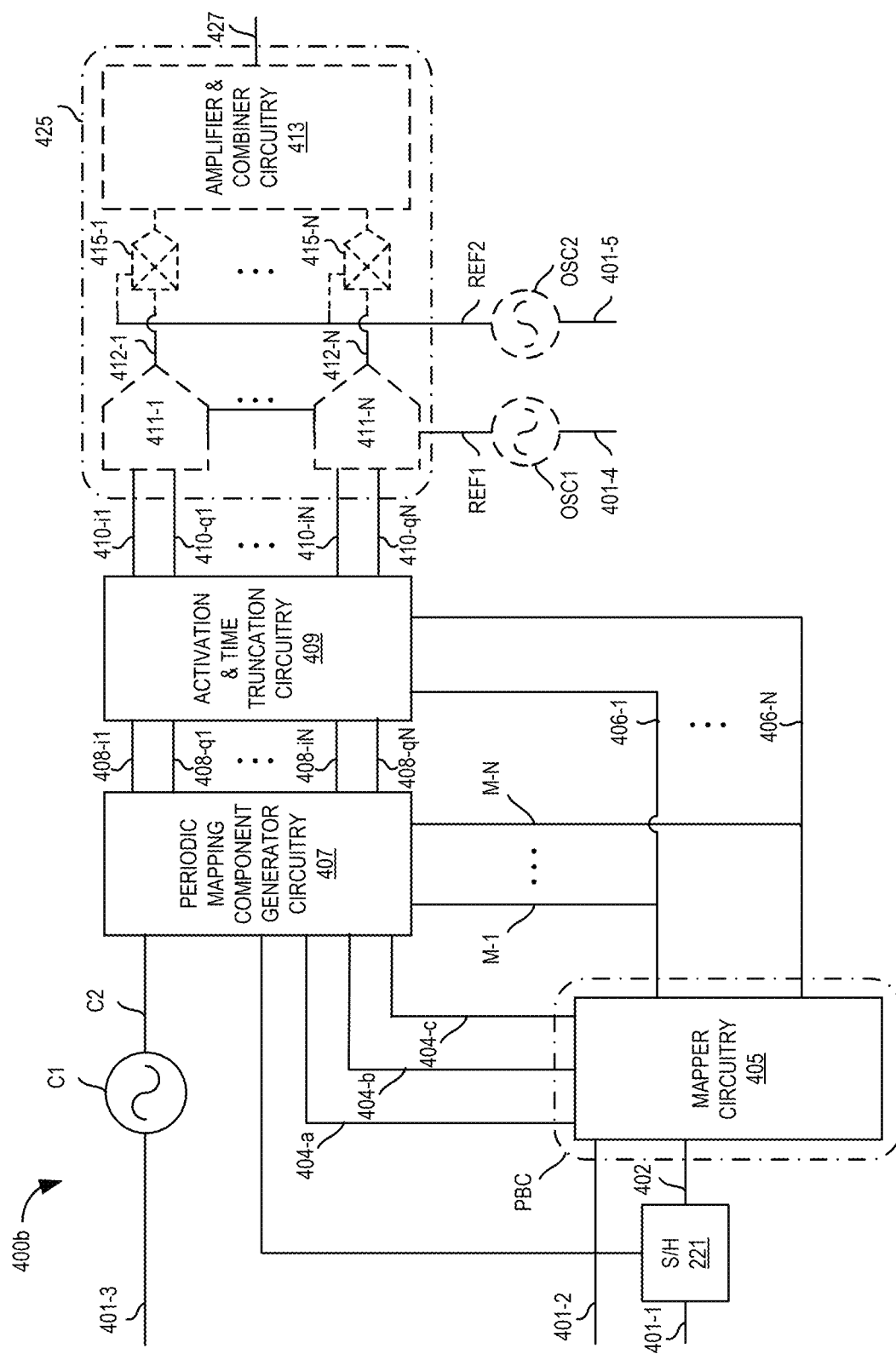

FIGS. 4A-4B illustrate embodiments of a system 400a,b of performing a decomposition into a sum of a limited set of truncated bandpass signals in accordance with various aspects as described herein. In FIG. 4A, the system 400a can receive an input signal 401-1 having the time samples $\tilde{S}_s = \tilde{S}(t_s) = \tilde{S}_{Iks} + jS_{Qks}$ representing a complex envelope of a bandpass signal $S_{bb}(t)$, with amplitudes assuming any value within a certain dynamic range. In one example, the input signal 401-1 can be a baseband signal $$S_{bb}(t) = \sum_{k=0}^{+\infty} A_k r(t-kT) + jB_k r(t-kT) = \sum_{k=0}^{+\infty} S_{Ik} r(t-kT) + jS_{Qk} r(t-kT),$$

which can be sampled by a sampling circuitry or a sample and hold circuitry 221 operable to generate the samples $\tilde{S}_s$ 402 represented by $\tilde{S}_s = \tilde{S}(t_s) = S_{iks} + jS_{Qks}$. In another example, the input signal 401-1 can include the samples $S_{Iks} = E_{ks} \cos(a_{ks}) = A_{ks}$ and $S_{Qks} = E_{ks} \cos(a_{ks}) = B_{ks}$ representing the in-phase and quadrature-phase components, where $$E_{ks} = \sqrt{S_{Iks}^2 + S_{Qks}^2} = \sqrt{A_{ks}^2 + B_{ks}^2}$$

and $a_{ks}$=arctan $(S_{Qks}/S_{Iks})$, with the signal 401-1 corresponding to the signal 402. The system 400a can also be configured to receive input signal 401-3 associated with a clock reference having a fundamental frequency for the periodic components in which each sample is decomposed, an input signal 401-4 associated with an intermediate frequency $f_i$, an input signal 401-5 associated with an RF carrier frequency $f_c$.

In FIG. 4A, a processing block circuitry PBC can include a first quantizer circuitry 403 and a mapper circuitry 405. The quantizer circuitry 403 operable to quantize a signal into a set of N bits can compute $E_{ks}$, $A_{ks}$ and $B_{ks}$ and can quantize $E_{ks}$ or $A_{ks}$ and $B_{ks}$ to limit the set of possible values to alphabets with dimension of $2^N$ values. The quantizer circuitry 403 can output, to a mapper circuitry 405, sets of quantization bits 404-{1, ..., N} that represent the quantized values of $A_{qks}$, $B_{qks}$ and $E_{qks}$. The mapper circuitry 405 can decompose $A_{qks}$ as a sum $$A_{qks} = \sum_{i=1}^{N} C_{I,ik} A_i,$$

with $$C_{I,ik} = \begin{cases} \pm 1 \\ 0 \end{cases},$$

and amplitudes $A_i$ belongings to a finite alphabet $A_i \in \{A_1, \ldots, A_N\}$ and related to periodic components with the same amplitude. Also, the mapper circuitry 405 can decompose the quantized value $B_{qks}$ as a sum $$B_{qks} = \sum_{i=1}^{N} C_{Q,ik} B_i$$

with $$C_{Q,ik} = \begin{cases} \pm 1 \\ 0 \end{cases}$$

and amplitudes $B_i$ belonging to a finite alphabet $B_i \in \{B_1, \ldots, B_N\}$ and can decompose the quantized value $E_{qks}$ of the sample amplitude $E_{ks}$ as $$E_{qks} = \sum_{i=1}^{N} C_{ik} E_i,$$

with $$C_{ik} = \begin{cases} \pm 1 \\ 0 \end{cases},$$

and amplitudes $E_i$ belonging to a finite alphabet $E_i \in \{E_1, \ldots, E_N\}$. The mapper circuitry can further compute and output, to an activation and time truncation circuitry 409, the set of N coefficients $C_{I,ik}$, $C_{Q,ik}$ and $C_{ik}$ 406-{1, ..., N}. The mapper circuitry 405 can also output, to a periodic mapping component generator circuitry 407, the finite alphabets $A_i \in \{A_1, \ldots, A_N\}$ 404-a, $B_i \in \{B_1, \ldots, B_N\}$ 404-b and $E_i \in \{E_1, \ldots, E_N\}$ 404-c to generate the periodic components 408-$i\{1, \ldots, N_b\}$, 408-$q\{1, \ldots, N\}$ in which each quantized amplitude of the in-phase and quadrature-phase components is decomposed as represented by $$s_{I,T_o}^{(i)}(t) = \sum_{n=-\infty}^{\infty} c_{I,n}^{(i)} \exp(j2\pi n f_0 t)$$

and $$s_{QT_o}^{(i)}(t) = \sum_{n=-\infty}^{\infty} c_{Q,n}^{(i)} \exp(j2\pi n f_0 t),$$

where coefficients $c_{I,n}^{(i)}$ and $c_{Q,n}^{(i)}$ are related to the periodic components with amplitude $A_i$ and $B_i$, respectively. The mapper circuitry 405 can also output, to the periodic mapping component generator circuitry 407, signals M-{1, . . . , N} associated with quantization components and mapping coefficients to generate the periodic mapping components.

In another embodiment, the periodic mapping component generator circuitry 407 can decompose $E_{qks}$ into a set of periodic mapping components 408-{1, . . . , N} represented by $$s_{T_o}^{(i)}(t) = \sum_{n=-\infty}^{\infty} c_{E,n}^{(i)}$$

exp(j2πnf₀t) with in-phase and quadrature-phase mapping components being generated based on $$\cos(\alpha_{ks}) s_{T_o}^{(i)}(t)$$

and $$\sin(\alpha_{ks}) s_{T_o}^{(i)}(t).$$

In another embodiment, a second quantizer circuitry 423 can receive, from the first quantizer circuitry 403, the quantization error $Q_E$ to generate a quantized quantization error $Q_{EQ}$ for input to the mapper circuitry 405.

In FIG. 4A, the activation and time truncation block 409 can active/deactivate and time truncate, based on the set of coefficients $C_{I,ik}$, $C_{Q,ik}$ 406-{1, . . . , N}, the sampling pulse duration $T_s$ and the pulse r(t), the set of periodic components 408-i {1, . . . , N}, 408-q{1, . . . , N} to obtain the set of N' truncated periodic components 410-i {1, . . . , N}, 410-q{1, . . . , N} represented by $$s_{Ik}^{(i)}(t) = \left[ C_{I,ik} s_{I,T_o}^{(i)}(t) \right] r(t - mT_s)$$

and $$s_{Qk}^{(i)}(t) = \left[ C_{Q,ik} s_{QT_o}^{(i)}(t) \right] r(t - mT_s),$$

respectively.

In another embodiment, for each sampling interval, the activation and time truncation circuitry 409 can generate the set of truncated components 410-{1, . . . , N} represented by $$s_k^{(i)}(t) = \left[ C_{ik} s_{T_o}^{(i)}(t) \right] e^{j\alpha_{ks}} r(t - mT_s).$$

In another embodiment, the activation and time truncation circuitry 409 can activate, based on the coefficients $C_{ik}$ of 406-{1, . . . , N}, the sampling pulse duration $T_s$ and pulse r(t), the set of N' time truncated periodic components 408-{1, . . . , N} to obtain the set of N truncated periodic components 410-{1, . . . , N} represented by $$s_k^{(i)}(t) = \left[ C_{ik} s_{T_o}^{(i)}(t) \right] e^{j\alpha_{ks}} r(t - mT_s).$$

In another embodiment, the mapper circuitry 405 can compute a set of N pairs of coefficients $C_{I,ik}$, $C_{Q,ik}$ or the set of N coefficients $C_{ik}$.

In another embodiment, each of the first quantizer circuitry 403 and the mapper circuitry 405 can include a LUT circuitry configured to store different quantization and mapping rules to enable generation of different sets of periodic mapping components associated with different input signals.

In another embodiment, the first quantizer circuitry 403, the mapper circuitry 405 and the generator circuitry 405 can be implemented in a single analog or digital circuitry block.

In FIGS. 4A-4B, the system 400*a,b* can include a circuitry 425 having a set of upconverter circuitry, a set of DACs or mixers, a set of power DACs or amplifiers, a combiner circuitry 413 or matching network circuitry, transducers, or the like. As illustrated in FIG. 4A, the circuitry 425 includes a set of power DACs 411-{1, . . . , N}, a set of mixer circuitry 415-{1, . . . , N}, and a combiner circuitry 413. The set of power DACs 411-{1, . . . , N} can receive the active set of N'≤N truncated periodic components 410-i {1, . . . , N}, 410-q{1, . . . , N} to obtain an active set of N' truncated periodic components 412-{1, . . . , N} as represented by $$s_k'^{(i)} = g_a^i \left[ s_{Ik}^{(i)}(t) \cos(2\pi f_c t) - s_{Qk}^{(i)}(t) \sin(2\pi f_c t) \right],$$

with $g_a^i$ denoting the gain of the power DAC associated with the $i^{th}$ periodic component. The set of mixer circuitry 415-{1, . . . , N} can up-convert the active set of N' truncated periodic components 412-{1, . . . , N} to obtain an active set of bandpass truncated periodic components at an RF carrier frequency $f_c$. The combiner circuitry 413 can combine the active set of bandpass truncated periodic components 412-{1, . . . , N} at the RF carrier frequency $f_c$ to obtain an output signal 427. The mapping tables, the quantization rules, the mapping coefficients and the coefficients of the periodic components can be stored in a LUT circuitry, having different mapping and quantization rules and different sets of Fourier coefficients.

In another embodiment, the activation and time truncation circuitry 409 can output, to the set of power DACs 411-{1, . . . , N}, the active set of truncated periodic components 410-i {1, . . . , N}, 410-q{1, . . . , N} to generate an active set of amplified truncated components at an intermediate frequency $f_i$ as $$s_k'^{(i)} = g_a^i \left[ s_{Ik}^{(i)}(t) \cos(2\pi f_i t) - s_{Qk}^{(i)}(t) \sin(2\pi f_i t) \right].$$

Further, the set of mixer circuitry 415-{1, . . . , N} can up-convert active set of amplified truncated components at an intermediate frequency $f_i$ to generate the active set of bandpass truncated periodic components 412-{1, . . . , N} at the RF carrier frequency $f_c$. The combiner circuitry 413 can combine the active set of bandpass truncated periodic components 412-{1, . . . , N} at the RF carrier frequency $f_c$ to obtain the output signal 427.

In another embodiment, the circuitry 425 can include the combiner circuitry 413 or a matching impedance network circuitry operable to combine, after amplification, the active set of amplified truncated periodic components to generate, for each sample interval $T_s$, the sum of the active set of amplified truncated periodic components $$S_{Ik}(t) = \sum_{i=1}^{N} g_a^i s_{Ik}^{\prime(i)}(t) \text{ and } S_{Qk}(t) = \sum_{i=1}^{N} g_a^{(i)} s_{Qk}^{\prime(i)}(t),$$

that are combined, by the combiner circuitry 413, to obtain the output signal 427 as the sum of N amplified bandpass truncated periodic mapping components $$s_{qbps} = \sum_{i=1}^{N} g_a^i s_k^{\prime(i)},$$

with $g_a^i$ the amplifier gain of the amplifier associated with the $i^{th}$ component, which is related to the periodic components with amplitude $A_i$ and $B_i$, respectively. The output signal 427 can be represented by $$s_{I,T_o}(t)$$

and $$s_{Q,T_o}(t)$$

as $$s_{qbps}(t) = \sum_{m=0}^{+\infty} s_{Ik}^{\prime(i)} - \sum_{m=0}^{+\infty} s_{Qk}^{\prime(i)},$$

where index k of sampled symbol changes over the sequence of samples.

In FIG. 4B, the system 400b can receive the input signal 401-1 having time samples of a complex envelope with a finite set of amplitudes. In another example, the input signal 401-1 can be a signal $$S_{bb}(t) = \sum_{k=0}^{+\infty} A_k r(t-kT) + jB_k r(t-kT) = \sum_{k=0}^{+\infty} S_{Ik} r(t-kT) + jS_{Qk} r(t-kT),$$

which is sampled by the sampling circuitry or the sample and hold circuitry 221 to generate the samples of the complex envelope signal $\tilde{S}_s$ 402 represented by $\tilde{S}_s = \tilde{S}(t_s) = S_{iks} + jS_{Qks}$. In another example, the input signal 401-1 can include the samples $S_{Iks} = E_{ks} \cos(a_{ks}) = A_{ks}$ and $S_{Qks} = E_{ks} \cos(a_{ks}) = B_{ks}$ of the in-phase and quadrature-phase components of a baseband signal, where $$E_{ks} = \sqrt{S_{Iks}^2 + S_{Qks}^2} = \sqrt{A_{ks}^2 + B_{ks}^2}$$

and $a_{ks} = \arctan(S_{Qks}/S_{Iks})$, with the signal 401-1 corresponding to the signal 402. The system 400b can also be configured to receive the input signal 401-3 associated with a fundamental frequency of the periodic components in which each sample is decomposed. The system 400b can also be configured to receive input signals 401-4, 401-5 associated with an intermediate frequency $f_i$ and a carrier frequency $f_c$, respectively.

In the current embodiment, a processing block circuitry PBC can include a mapper circuitry 405 operable to compute $E_{ks}$, $A_{ks}$ and $B_{ks}$, decompose $E_{ks}$ or $A_{ks}$ and $B_{ks}$ based on a mapping table, with $A_{ks}$ being decomposed as a sum $$A_{ks} = \sum_{i=1}^{N} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, \ldots, A_N\}$ and related to periodic components with the same amplitude. Also, the mapper circuitry 405 can decompose the computed value $B_{ks}$ as a sum $$B_{ks} = \sum_{i=1}^{N} C_{Q,ik} B_i$$

with $$C_{Q,ik} = \begin{cases} \pm 1 \\ 0 \end{cases}$$

and amplitudes $B_i$ belonging to a finite alphabet $B_i \in \{B_1, \ldots, B_N\}$ and can decompose the computed value $E_{ks}$ of the sample amplitude as $$E_{ks} = \sum_{i=1}^{N} C_{ik} E_i,$$

with $$C_{ik} = \begin{cases} \pm 1 \\ 0 \end{cases},$$

and amplitudes $E_i$ belonging to a finite alphabet $E_i \in \{E_1, \ldots, E_N\}$.

In FIG. 4B, the mapper circuitry 405 can compute and output, to the activation and time truncation circuitry 409, sets of N coefficients $C_{I,ik}$, $C_{Q,ik}$ and $C_{ik}$ 406-$\{1, \ldots, N\}$. The mapper circuitry 405 can also output, to the periodic mapping component generator circuitry 407, the signals 404-a, 404-b, 404-c that respectively represents the finite alphabets $A_i \in \{A_1, \ldots, A_N\}$, $B_i \in \{B_1, \ldots, B_N\}$ and E; E $\{E_1, \ldots, E_N\}$, to generate the set of periodic mapping components 408-$i\{1, \ldots, N\}$, 408-$q\{1, \ldots, N\}$ in which each quantized amplitude of the in-phase and quadrature-phase components is decomposed, represented by $$s_{I,T_o}^{(i)}(t) = \sum_{n=-\infty}^{\infty} c_{I,n}^{(i)} \exp(j2\pi n f_0 t)$$

and $$s_{QT_o}^{(i)}(t) = \sum_{n=-\infty}^{\infty} c_{Q,n}^{(i)} \exp(j2\pi n f_0 t),$$

where coefficients $c_{I,n}^{(i)}$ and $c_{Q,n}^{(i)}$ are related to the periodic components with amplitude $A_i$ and $B_i$, respectively. The activation and time truncation circuitry 409 can activate and time truncate, based on the set of coefficients $C_{I,ik}$, $C_{Q,ik}$ 406-{1, ..., N}, the sampling pulse duration $T_s$ and the pulse r(t), the set of periodic components 408-$i$ {1, ..., N}, 408-$q${1, ..., N} and generate the N truncated versions 410-$i${1, ..., N}, 410-$q${1, ..., N} represented by $$s_{Ik}^{(i)}(t) = \left[C_{I,ik} s_{I,T_o}^{(i)}(t)\right] r(t - mT_s)$$

and $$s_{Qk}^{(i)}(t) = \left[C_{Q,ik} s_{QT_o}^{(i)}(t)\right] r(t - mT_s),$$

In another embodiment, the periodic mapping component generator circuitry 407 can decompose $E_{qks}$ into a set of periodic mapping components $$408 - \{1, \ldots, N\} s_{T_o}^{(i)}(t) = \sum_{n=-\infty}^{\infty} c_{E,n}^{(i)} \exp(j2\pi n f_0 t)$$

and generate a set of in-phase and quadrature-phase mapping components based on $$\cos(\alpha_{ks}) s_{T_o}^{(i)}(t)$$

and $$\sin(\alpha_{ks}) s_{T_o}^{(i)}(t).$$

In another embodiment, the activation and time truncation circuitry 409 can activate, based on the coefficients $C_{ik}$ 406-{1, ..., N}, the sampling pulse duration $T_s$ and the pulse r(t), the set of N' time truncated periodic components 408-{1, ..., N} to obtain the active set of N truncated periodic components 410-{1, ..., N} represented by $$s_k^{(i)}(t) = \left[C_{ik} s_{T_o}^{(i)}(t)\right] e^{j\alpha_{ks}} r(t - mT_s).$$

In another embodiment, the circuitry block 425 can include a set of power DACs 411-{1, ..., N} operable to receive an active set of N'≤N truncated periodic components 410-$i${1, ..., N}, 410-$q${1, ..., N} or 410-{1, ..., N} to generate an active set of N' amplified truncated periodic components 412-{1, ..., N} represented by $$s_k^{\prime(i)} = s_{Ik}^{(i)}(t)\cos(2\pi f_c t) - s_{Qk}^{(i)}(t)\sin(2\pi f_c t).$$

The combiner circuitry 413 can combine the active set of N' amplified truncated periodic components 412-{1, ..., N} to obtain the output signal 427.

In another embodiment, the set of truncated periodic mapping components 410-$i${1, ..., N}, 410-$q${1, ..., N} can be output to a set of DACs that up-convert the set of truncated periodic mapping components 410-$i${1, ..., N}, 410-$q${1, ..., N} to an intermediate frequency $f_i$ as represented by $$s_{Ik}^{\prime(i)} = s_{Ik}^{(i)}(t)\cos(2\pi f_i t)$$

and $$s_{Qk}^{\prime(i)} = -s_{Qk}^{(i)}(t)\sin(2\pi f_i t).$$

Further, a set of mixer circuitry 415-{1, ..., N} can up-convert to the carrier frequency $f_c$.

In another embodiment, the mapper circuitry 405 and the generator 407 can be implemented in a single analog or digital circuitry block.

In another embodiment, the circuitry block 425 can include the combiner circuitry 413 operable to combine the set of in-phase truncated periodic components, represented by $$S_{Ik}(t) = \sum_{i=1}^{N} s_{Ik}^{\prime(i)}(t),$$

and combine the set of quadrature-phase truncated periodic components, represented by $$S_{Qk}(t) = \sum_{i=1}^{N} s_{Qk}^{\prime(i)}(t),$$

to generate, for each sample interval $T_s$, the sum of the set of truncated periodic mapping components to obtain the output signal 427, represented as the sum of N bandpass truncated periodic mapping components $$s_{qbps}(t) = \sum_{i=1}^{N} s_{Ik}^{(i)}(t)\cos(2\pi f_c t) - \sum_{i=1}^{N} s_{Qk}^{(i)}(t)\sin(2\pi f_c t),$$

with $s_{Ik}^{(i)}(t)$ and $s_{Qk}^{(i)}(t)$ truncated versions related to the periodic components with amplitude $A_i$ and $B_i$, respectively. The output signal 427 can be expressed in terms $$s_{I,T_o}(t)$$

and $$s_{Q,T_o}(t)$$

as $$s_{qbps}(t) = \sum_{m=0}^{+\infty} s_{Ik}^{\prime(i)} - \sum_{m=0}^{+\infty} s_{Qk}^{\prime(i)},$$

where index k of sampled symbol changes over the sequence of samples.

Figure 5B:
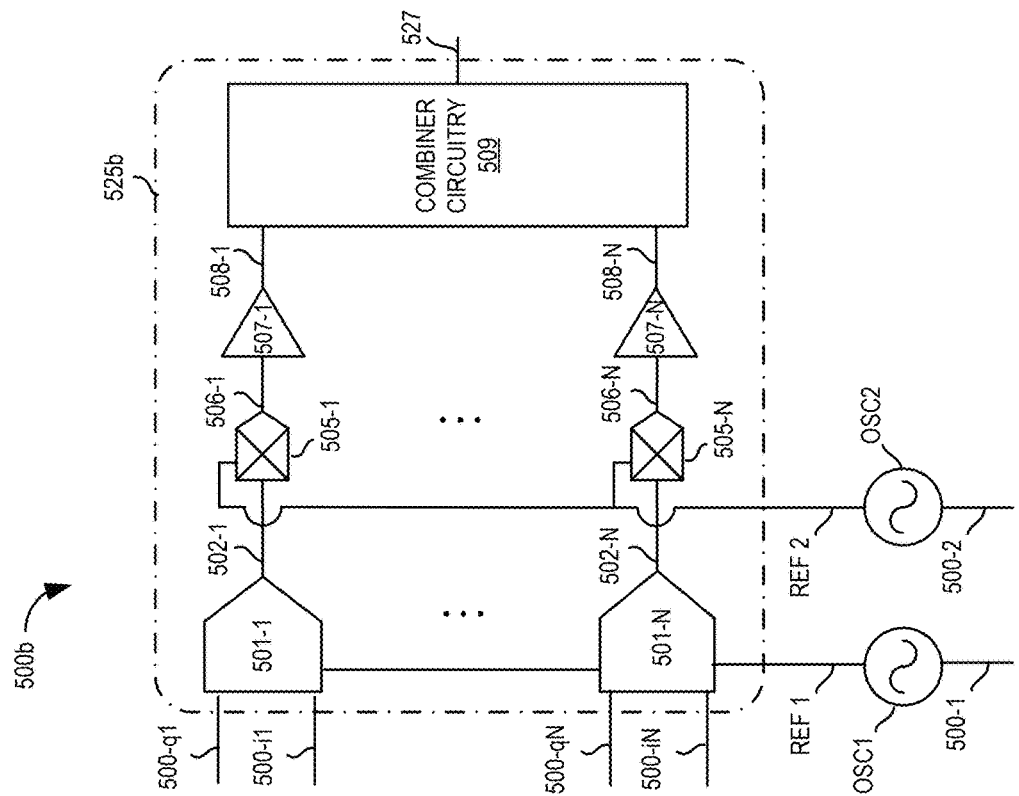
FIGS. 5A-5D illustrate embodiments of a system of amplifying and combining a set of truncated bandpass signals in accordance with various aspects as described herein.
Figure 5A:
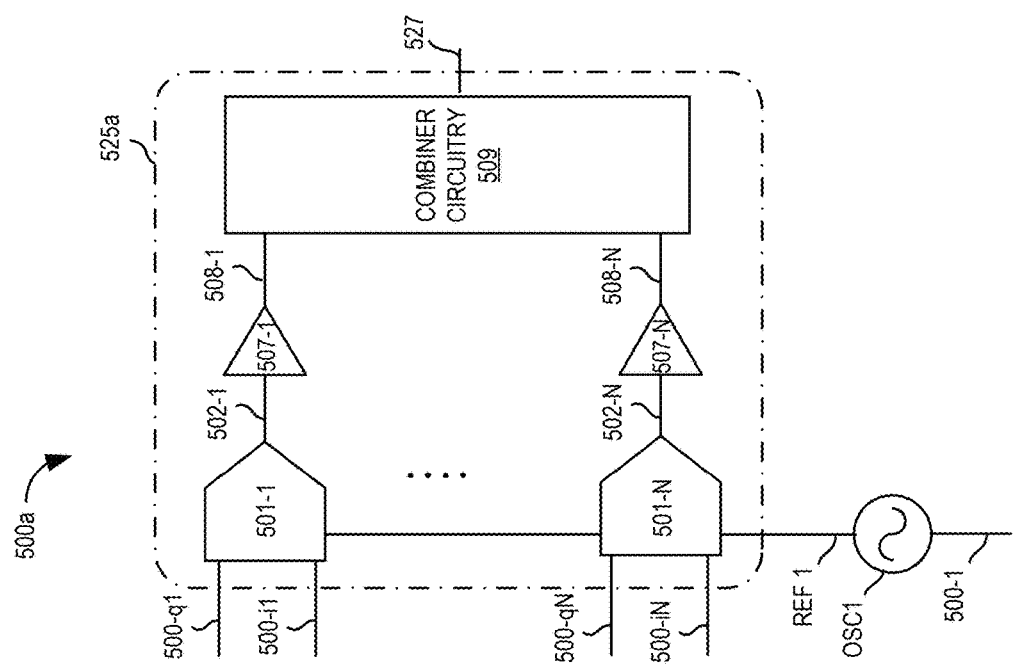

FIGS. 5A-5D illustrate embodiments of a system 500a-d of amplifying and combining a set of truncated bandpass signals in accordance with various aspects as described herein. The systems 500a-d can represent exemplary embodiments of the circuitry 425 in FIGS. 4A and 4B. In FIG. 5A, the system 500a can receive a reference signal 500-1 having a carrier frequency $f_c$. A set of DACs 501-$\{1, \ldots, N\}$ can receive an active set of N' truncated periodic components 500-$i\{1, \ldots, N\}$, 500-$q\{1, \ldots, N\}$ and can generate an active set of N' bandpass truncated periodic components 502-$\{1, \ldots, N\}$ at the carrier frequency $f_c$, as represented by $$s_k'^{(i)} = s_k^{(i)}(t)\cos(2\pi f_c t) - s_{Qk}^{(i)}(t)\sin(2\pi f_c t).$$

The active set of N' truncated periodic components 500-$i\{1, \ldots, N\}$, 500-$q\{1, \ldots, N\}$ correspond to the signals 410-$i\{1, \ldots, N\}$, 410-$q\{1, \ldots, N\}$ of FIGS. 4A and 4B. A set of amplifiers 507-$\{1, \ldots, N\}$ can amplify the active set of N' bandpass truncated periodic components 502-$\{1, \ldots, N\}$ to obtain an active set of N' amplified bandpass truncated periodic components 508-$\{1, \ldots, N\}$ at the carrier frequency $f_c$, as represented by $g_a^i s'_k{}^{(i)}$, where $g_a^i$ denotes the amplifier gain of the amplifier associated with the $i^{th}$ component. A combiner circuitry or a matching impedance network 509 can combine the active set of N' amplified bandpass truncated periodic components 508-$\{1, \ldots, N\}$ to obtain an output signal 527, which represents a sum of N bandpass truncated periodic mapping components $$s_{qbps} = \sum_{i=1}^{N} g_a^i s_k'^{(i)}.$$

In FIG. 5B, the system 500b can receive the reference signal 500-1 associated with an intermediate frequency $f_i$ and a reference signal 500-2 associated with the carrier frequency $f_c$. A set of DACs 501-$\{1, \ldots, N\}$ can receive an active set of N' truncated periodic components 500-$i\{1, \ldots, N\}$, 500-$q\{1, \ldots, N\}$ and can generate an active set of N' bandpass truncated periodic components 502-$\{1, \ldots, N\}$ at the intermediate frequency $f_i$, as represented by $$s_k'^{(i)} = s_{Ik}^{(i)}(t)\cos(2\pi f_i t) - s_{Qk}^{(i)}(t)\sin(2\pi f_i t).$$

A set of mixers 505-$\{1, \ldots, N\}$ can up-convert these components 502-$\{1, \ldots, N\}$ to generate an active set of N' bandpass truncated periodic components 506-$\{1, \ldots, N\}$ at the carrier frequency $f_c$. A set of amplifiers 507-$\{1, \ldots, N\}$ can amplify the active set of N' bandpass truncated periodic components 506-$\{1, \ldots, N\}$ to generate an active set of N' amplified bandpass truncated periodic components 508-$\{1, \ldots, N\}$, as represented by $g_a^i s'_k{}^{(i)}$, where $g_a^i$ denotes the amplifier gain of the amplifier associated with the $i^{th}$ component. A combiner circuitry 509 can combine the active set of N' amplified bandpass truncated periodic components 508-$\{1, \ldots, N\}$ to obtain an output signal 527, which represents the sum of N' active amplified bandpass truncated periodic mapping components.

Figure 5C:
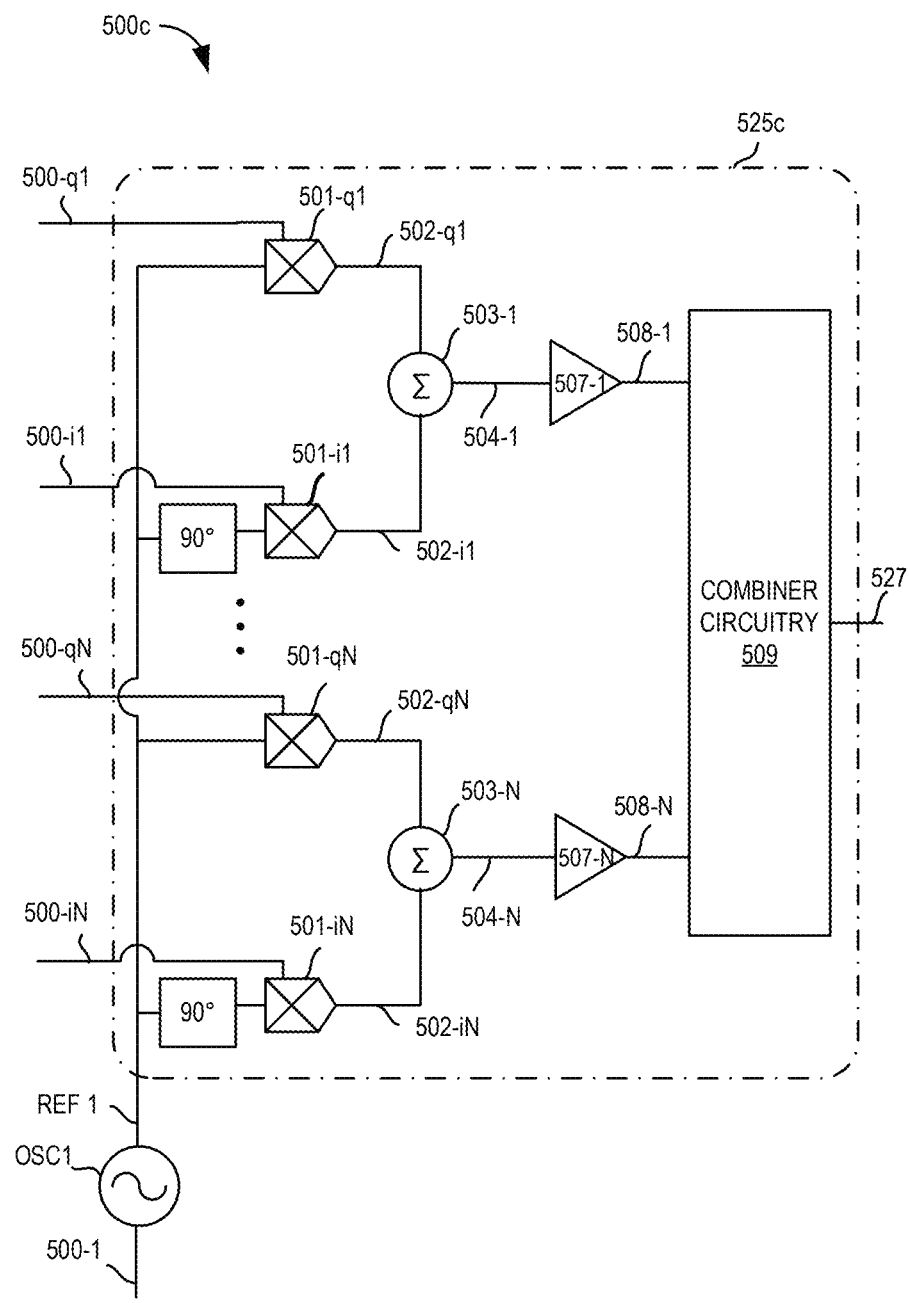

In FIG. 5C, the system 500c can receive the reference signal 500-1 associated with the carrier frequency $f_c$. A set of mixers 501-$i\{1, \ldots, N\}$, 501-$q\{1, \ldots, N\}$ can receive an active set of N' truncated periodic components 500-$i\{1, \ldots, N\}$, 500-$q\{1, \ldots, N\}$ and can multiply these components 500-$i\{1, \ldots, N\}$, 500-$q\{1, \ldots, N\}$ by both cos $(2\pi f_c t)$ and $-\sin(2\pi f_c t)$ to generate an active set of N' bandpass truncated periodic components 502-$i\{1, \ldots, N\}$, 502-$q\{1, \ldots, N\}$ at the carrier frequency $f_c$, as represented by $$s_{Ik}'^{(i)} = s_{Ik}^{(i)}(t)\cos(2\pi f_c t)$$

and $$s_{Qk}'^{(i)} = -s_{Qk}^{(i)}(t)\sin(2\pi f_c t).$$

The signals 500-$i\{1, \ldots, N\}$, 500-$q\{1, \ldots, N\}$ correspond to the signals 410-$i\{1, \ldots, N\}$, 410-$q\{1, \ldots, N\}$ of FIGS. 4A and 4B. A set of adder circuitry 503-$\{1, \ldots, N\}$ can sum each pair of in-phase and quadrature-phase components 502-$i\{1, \ldots, N\}$, 502-$q\{1, \ldots, N\}$ to obtain an active set of N' bandpass truncated periodic components 504-$\{1, \ldots, N\}$ at the carrier frequency $f_c$, as represented by $$s_k'^{(i)} = s'_{Ik} + s'^{(i)}_{Qk}.$$

set of amplifiers 507-$\{1, \ldots, N\}$ can amplify each component 504-$\{1, \ldots, N\}$ to generate an active set of N' bandpass truncated periodic components 508-$\{1, \ldots, N\}$ at the carrier frequency $f_c$. Further, a combiner circuitry or a matching impedance network 507 can combine the amplified components 508-$\{1, \ldots, N\}$, as represented by $g_a^i s'_k{}^{(i)}$ where $g_a^i$ denotes the amplifier gain of the amplifier associated with the $i^{th}$ component, to generate an output signal 527, as represented by the sum of N' active bandpass truncated periodic mapping components, given by $$s_{qbps} = \sum_{i=1}^{N} g_a^i s_k'^{(i)}.$$

Figure 5D:
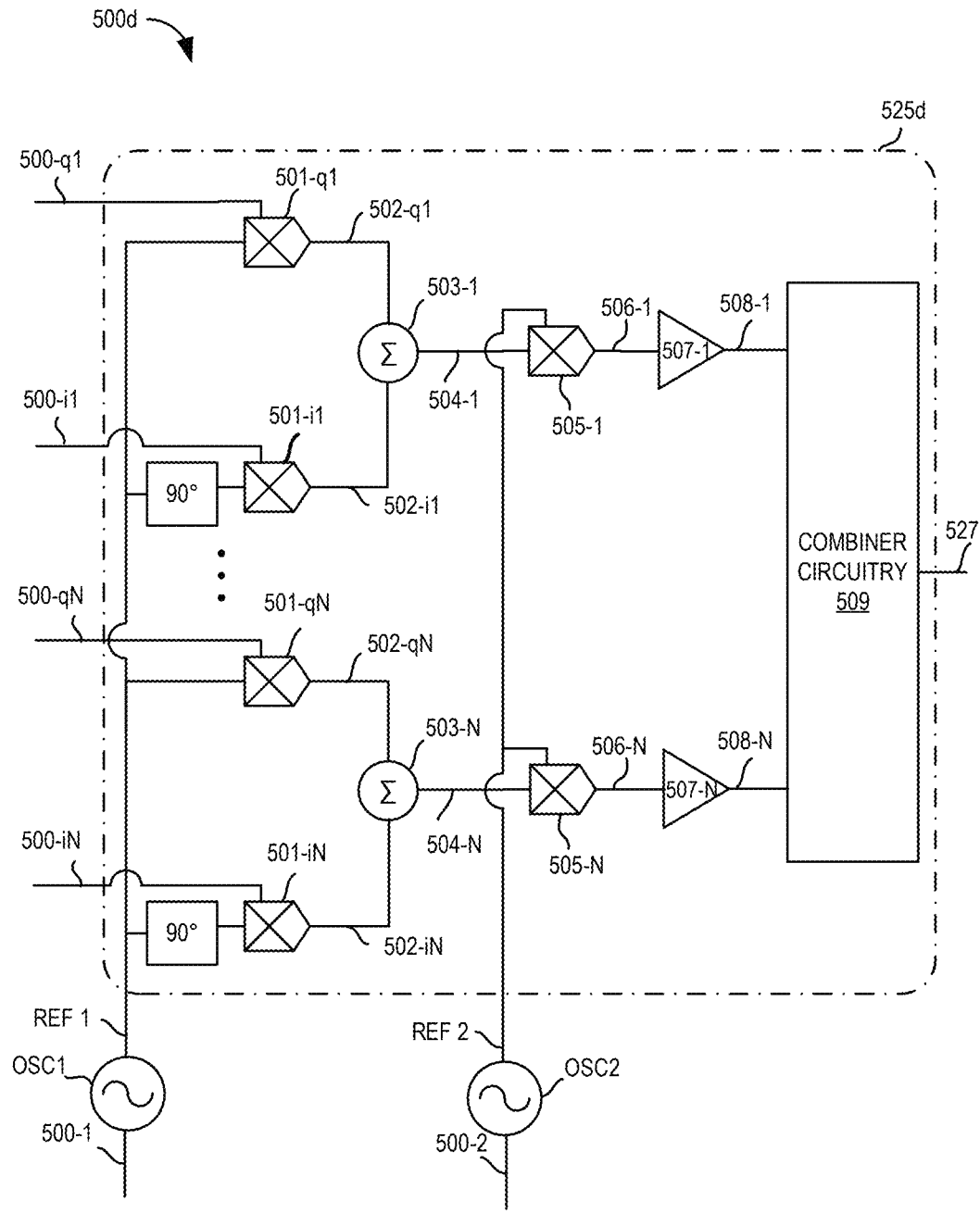

In FIG. 5D, the system 500d can receive the reference signal 500-1 associated with the intermediate frequency f; and the reference signal 501-2 associated with the carrier frequency $f_c$. A set of mixers 501-$i\{1, \ldots, N\}$, 501-$q\{1, \ldots, N\}$ can receive an active set of N' truncated periodic components 500-$i\{1, \ldots, N\}$, 500-$q\{1, \ldots, N\}$ and can multiply these components 500-$i\{1, \ldots, N\}$, 500-$q\{1, \ldots, N\}$ by cos $(2\pi f_i t)$ and $-\sin(2\pi f_i t)$ to generate an active set of N' bandpass truncated periodic components 502-$i\{1, \ldots, N\}$, 502-$q\{1, \ldots, N\}$ at the intermediate frequency ft. The signals 500-$i\{1, \ldots, N\}$, 500-$q\{1, \ldots, N\}$ correspond to the signals 410-$i\{1, \ldots, Np\}$, 410-$q\{1, \ldots, N\}$ of FIGS. 4A and 4B. A set of adder circuitry 503-$\{1, \ldots, N\}$ can combine each pair of in-phase and quadrature phase components 502-$i\{1, \ldots, N\}$, 502-$q\{1, \ldots, N\}$ to generate an active set of N' bandpass truncated periodic components 504-$\{1, \ldots, N\}$ at the intermediate frequency $f_i$, as represented by $$s_k'^{(i)} = s_{Ik}^{(i)}(t)\cos(2\pi f_i t) - s_{Qk}^{(i)}(t)\sin(2\pi f_i t).$$

A set of mixers 505-{1, ..., N} can upconvert the components 504-{1, ..., N} to generate an active set of N' bandpass truncated periodic components 506-{1, ..., N} at the carrier frequency $f_c$. A set of amplifiers 507-{1, ..., N} can amplify the component 506-{1, ..., N} to generate an active set of N' amplified bandpass truncated periodic components 508-{1, ..., N} at the carrier frequency $f_c$. A combiner circuitry 509 can combine the outputs of the set of amplifiers 507-{1, ..., N} to obtain the output signal 527, as represented by the sum of N' bandpass truncated periodic mapping components.

In another embodiment, the set of amplifiers can be electrically coupled to a set of transducers.

Figure 6:
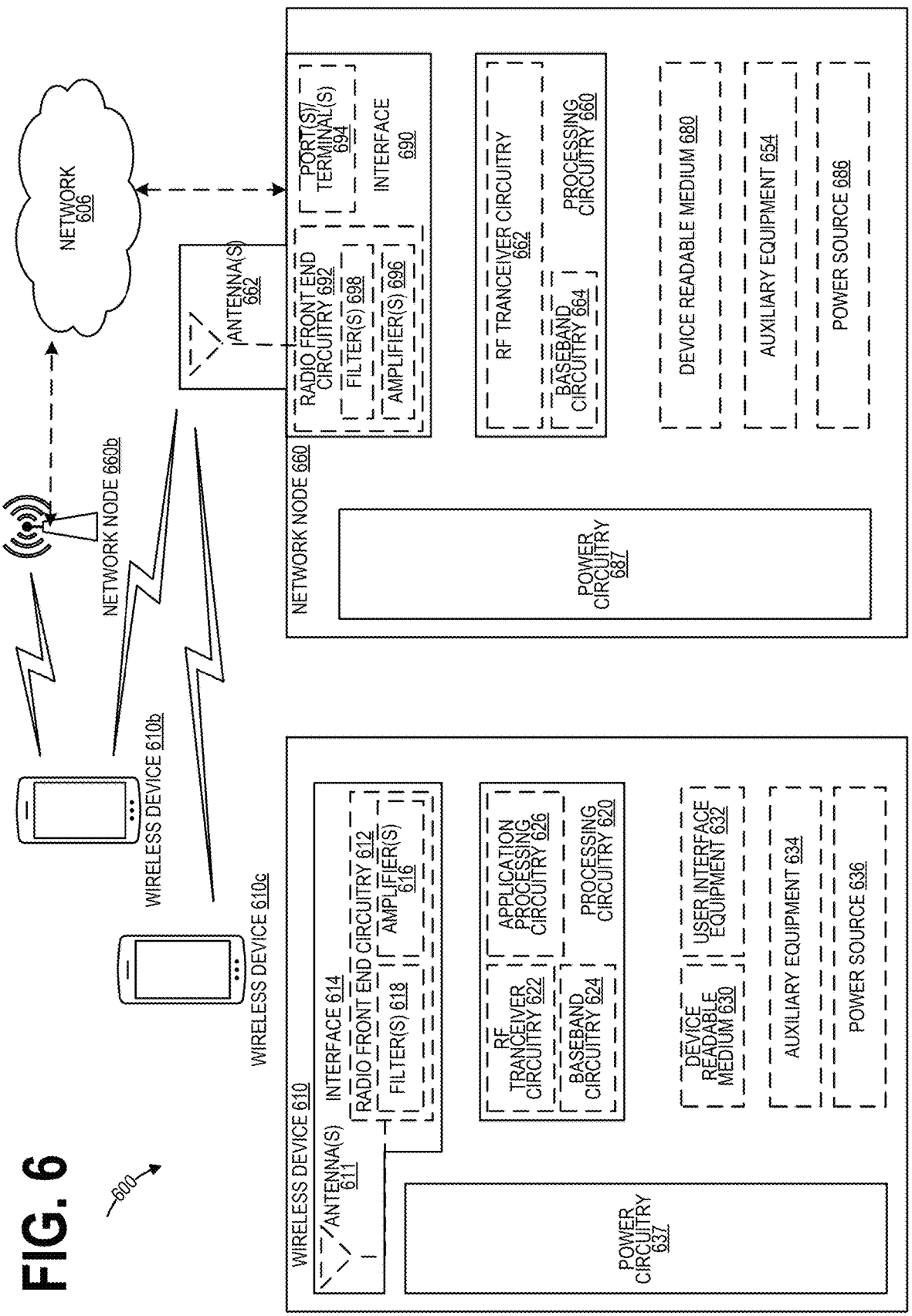
FIG. 6 illustrates one embodiment of a wireless communication network in accordance with various aspects as described herein.

Although the subject matter described herein may be implemented in any appropriate type of system using any suitable components, the embodiments disclosed herein may also be described in relation to a wireless network, such as the example wireless network illustrated in FIG. 6. For simplicity, the wireless network of FIG. 6 only depicts network 606, network nodes 660 and 660b, and wireless devices 610, 610b, and 610c. In practice, a wireless network may further include any additional elements suitable to support communication between wireless devices or between a wireless device and another communication device, such as a landline telephone, a service provider, or any other network node or end device. Of the illustrated components, network node 660 and wireless device 610 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), Narrowband Internet of Things (NB-IoT), and/or other suitable 2G, 3G, 4G, 5G, 6G standards; wireless local area network (WLAN) standards, such as the IEEE 602.11 standards; and/or any other appropriate wireless communication standard, such as the Worldwide Interoperability for Microwave Access (WiMax), Bluetooth, Z-Wave and/or ZigBee standards.

Network 606 may comprise one or more backhaul networks, core networks, Internet Protocol (IP) networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 660 and wireless device 610 comprise various components described in more detail below. These components work together to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs), and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 6, network node 660 includes processing circuitry 670, device readable medium 680, interface 690, auxiliary equipment 654, power source 656, power circuitry 657, and antenna 662. Although network node 660 illustrated in the example wireless network of FIG. 6 may represent a device that includes the illustrated combination of hardware components, other embodiments may comprise network nodes with different combinations of components. It is to be understood that a network node comprises any suitable combination of hardware and/or software to perform the tasks, features, functions and methods disclosed herein. Moreover, while the components of network node 660 are depicted as single boxes located within a larger box, or nested within multiple boxes, in practice, a network node may comprise multiple different physical components that make up a single illustrated component (e.g., device readable medium 680 may comprise multiple separate hard drives as well as multiple random access memory (RAM) modules).

Similarly, network node 660 may be composed of multiple physically separate components (e.g., a NodeB component and a radio network controller (RNC) component, or a BTS component and a BSC component, etc.), which may each have their own respective components. In certain scenarios in which network node 660 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 660 may be configured to support multiple radio access technologies (RATs). In such embodiments, some components may be duplicated (e.g., separate device readable medium 680 for the different RATs) and some components may be reused (e.g., the same antenna 662 may be shared by the RATs). Network node 660 may also include multiple sets of the various illustrated components for different wireless technologies integrated into network node 660, such as, for example, GSM, code division multiple access (CDMA), wideband code division multiple access (WCDMA), LTE, NR, Wi-Fi, or Bluetooth wireless technologies. These wireless technologies may be integrated into the same or different chip or set of chips and other components within network node 660.

Processing circuitry 670 is configured to perform any determining, calculating, or similar operations (e.g., certain obtaining operations) described herein as being provided by a network node. These operations performed by processing circuitry 670 may include processing information obtained by processing circuitry 670 by, for example, converting the obtained information into other information, comparing the obtained information or converted information to information stored in the network node, and/or performing one or more operations based on the obtained information or converted information, and as a result of said processing making a determination.

Processing circuitry 670 may comprise a combination of one or more of a microprocessor, controller, microcontroller, central processing unit, digital signal processor (DSP), application-specific integrated circuitry (ASIC), field-programmable gate array (FPGA), or any other suitable computing device, resource, or combination of hardware, software and/or encoded logic operable to provide, either alone or in conjunction with other network node 660 components, such as device readable medium 680, network node 660 functionality. For example, processing circuitry 670 may execute instructions stored in device readable medium 680 or in memory within processing circuitry 670. Such functionality may include providing any of the various wireless features, functions, or benefits discussed herein. In some embodiments, processing circuitry 670 may include a system on a chip (SOC).

In some embodiments, processing circuitry 670 may include one or more of RF transceiver circuitry 672 and baseband processing circuitry 674. In some embodiments, RF transceiver circuitry 672 and baseband processing circuitry 674 may be on separate chips (or sets of chips), boards, or units, such as radio units and digital units. In alternative embodiments, part or all of RF transceiver circuitry 672 and baseband processing circuitry 674 may be on the same chip or set of chips, boards, or units. The embodiments described by this disclosure can be implemented for the network node 660 in the interface 690 and/or the processing circuitry 670. Further, the embodiments described by this disclosure can be implemented for the wireless device or user equipment 610 in the interface 614 and/or the processing circuitry 620.

In certain embodiments, some or all of the functionality described herein as being provided by a network node, base station, eNB or other such network device may be performed by processing circuitry 670 executing instructions stored on device readable medium 680 or memory within processing circuitry 670. In alternative embodiments, some or all of the functionalities may be provided by processing circuitry 670 without executing instructions stored on a separate or discrete device readable medium, such as in a hard-wired manner. In any of those embodiments, whether executing instructions stored on a device readable storage medium or not, processing circuitry 670 may be configured to perform the described functionality. The benefits provided by such functionality are not limited to processing circuitry 670 alone or to other components of network node 660 but are enjoyed by network node 660 as a whole, and/or by end users and the wireless network generally.

Device readable medium 680 may comprise any form of volatile or non-volatile computer readable memory including, without limitation, persistent storage, solid-state memory, remotely mounted memory, magnetic media, optical media, RAM, read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 670. Device readable medium 680 may store any suitable instructions, data or information, including a computer program, software, an application including one or more of logic, rules, code, tables, etc. and/or other instructions capable of being executed by processing circuitry 670 and, utilized by network node 660. Device readable medium 680 may be used to store any calculations made by processing circuitry 670 and/or any data received via interface 690. In some embodiments, processing circuitry 670 and device readable medium 680 may be integrated.

Interface 690 is used in the wired or wireless communication of signaling and/or data between network node 660, network 606, and/or wireless devices 610, 410*b*, 610*c*. As illustrated, interface 690 comprises port(s)/terminal(s) 694 to send and receive data, for example to and from network 606 over a wired connection. Interface 690 also includes radio front end circuitry 692 that may be coupled to, or in certain embodiments a part of, antenna 662. Radio front end circuitry 692 comprises filters 698 and amplifiers 696. Radio front end circuitry 692 may be connected to antenna 662 and processing circuitry 670. Radio front end circuitry may be configured to condition signals communicated between antenna 662 and processing circuitry 670. Radio front end circuitry 692 may receive digital data that is to be sent out to other network nodes or wireless devices via a wireless connection. Radio front end circuitry 692 may convert the digital data into a radio signal having the appropriate channel and bandwidth parameters using a combination of filters 698 and/or amplifiers 696. The radio signal may then be transmitted via antenna 662. Similarly, when receiving data, antenna 662 may collect radio signals which are then converted into digital data by radio front end circuitry 692. The digital data may be passed to processing circuitry 670. In other embodiments, the interface may comprise different components and/or different combinations of components.

In certain alternative embodiments, network node 660 may not include separate radio front end circuitry 692, instead, processing circuitry 670 may comprise radio front end circuitry and may be connected to antenna 662 without separate radio front end circuitry 692. Similarly, in some embodiments, all or some of RF transceiver circuitry 672 may be considered a part of interface 690. In still other embodiments, interface 690 may include one or more ports or terminals 694, radio front end circuitry 692, and RF transceiver circuitry 672, as part of a radio unit (not shown), and interface 690 may communicate with baseband processing circuitry 674, which is part of a digital unit (not shown).

Antenna 662 may include one or more antennas, or antenna arrays, configured to send and/or receive wireless signals. Antenna 662 may be coupled to radio front end circuitry 690 and may be any type of antenna capable of transmitting and receiving data and/or signals wirelessly. In some embodiments, antenna 662 may comprise one or more omni-directional, sector or panel antennas operable to transmit/receive radio signals between, for example, 2 GHz and 66 GHZ. An omni-directional antenna may be used to transmit/receive radio signals in any direction, a sector antenna may be used to transmit/receive radio signals from devices within a particular area, and a panel antenna may be a line-of-sight antenna used to transmit/receive radio signals in a relatively straight line. In some instances, the use of more than one antenna may be referred to as multiple-input multiple-output (MIMO). In certain embodiments, antenna 662 may be separate from network node 660 and may be connectable to network node 660 through an interface or port.

Antenna 662, interface 690, and/or processing circuitry 670 may be configured to perform any receiving operations and/or certain obtaining operations described herein as being performed by a network node. Any information, data and/or signals may be received from a wireless device, another network node and/or any other network equipment. Similarly, antenna 662, interface 690, and/or processing circuitry 670 may be configured to perform any transmitting operations described herein as being performed by a network node. Any information, data and/or signals may be transmitted to a wireless device, another network node and/or any other network equipment.

Power circuitry 687 may comprise, or be coupled to, power management circuitry and is configured to supply the components of network node 660 with power for performing the functionality described herein. Power circuitry 687 may receive power from power source 686. Power source 686 and/or power circuitry 687 may be configured to provide power to the various components of network node 660 in a form suitable for the respective components (e.g., at a voltage and current level for each respective component). Power source 686 may either be included in, or external to, power circuitry 687 and/or network node 660. For example, network node 660 may be connectable to an external power source (e.g., an electricity outlet) via an input circuitry or interface such as an electrical cable, whereby the external power source supplies power to power circuitry 687. As a further example, power source 686 may comprise a source of power in the form of a battery or battery pack which is connected to, or integrated in, power circuitry 687. The battery may provide backup power should the external power source fail. Other types of power sources, such as photovoltaic devices, may also be used.

Alternative embodiments of network node 660 may include additional components beyond those shown in FIG. 6 that may be responsible for providing certain aspects of the network node's functionality, including any of the functionality described herein and/or any functionality necessary to support the subject matter described herein. For example, network node 660 may include user interface equipment to allow input of information into network node 660 and to allow output of information from network node 660. This may allow a user to perform diagnostic, maintenance, repair, and other administrative functions for network node 660.

As used herein, wireless device refers to a device capable, configured, arranged and/or operable to communicate wirelessly with network nodes and/or other wireless devices. Unless otherwise noted, the term wireless device may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a wireless device may be configured to transmit and/or receive information without direct human interaction. For instance, a wireless device may be designed to transmit information to a network on a predetermined schedule, when triggered by an internal or external event, or in response to requests from the network. Examples of a wireless device include, but are not limited to, a smart phone, a mobile phone, a cell phone, a voice over IP (VOIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A wireless device may support device-to-device (D2D) communication, for example by implementing a 3rd Generation Partnership Project (3GPP) standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a wireless device may represent a machine or other device that performs monitoring and/or measurements and transmits the results of such monitoring and/or measurements to another wireless device and/or a network node. The wireless device may in this case be a machine-to-machine (M2M) device, which may in a 3GPP context be referred to as an MTC device. As one example, the wireless device may be a UE implementing the 3GPP narrow band internet of things (NB-IoT) standard. Examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a wireless device may represent a vehicle or other equipment that is capable of monitoring and/or reporting on its operational status or other functions associated with its operation. A wireless device as described above may represent the endpoint of a wireless connection, in which case the device may be referred to as a wireless terminal. Furthermore, a wireless device as described above may be mobile, in which case it may also be referred to as a mobile device or a mobile terminal.

As illustrated, wireless device 610 includes antenna 611, interface 614, processing circuitry 620, device readable medium 630, user interface equipment 632, auxiliary equipment 634, power source 636 and power circuitry 637. Wireless device 610 may include multiple sets of one or more of the illustrated components for different wireless technologies supported by wireless device 610, such as, for example, GSM, WCDMA, LTE, NR, Wi-Fi, WiMAX, NB-IoT, or Bluetooth wireless technologies, just to mention a few. These wireless technologies may be integrated into the same or different chips or set of chips as other components within wireless device 610.

Antenna 611 may include one or more antennas or antenna arrays, configured to send and/or receive wireless signals, and is connected to interface 614. In certain alternative embodiments, antenna 611 may be separate from wireless device 610 and be connectable to wireless device 610 through an interface or port. Antenna 611, interface 614, and/or processing circuitry 620 may be configured to perform any receiving or transmitting operations described herein as being performed by a wireless device. Any information, data and/or signals may be received from a network node and/or another wireless device. In some embodiments, radio front end circuitry and/or antenna 611 may be considered an interface.

As illustrated, interface 614 comprises radio front end circuitry 612 and antenna 611. Radio front end circuitry 612 comprises one or more filters 618 and amplifiers 616. Radio front end circuitry 612 is connected to antenna 611 and processing circuitry 620 and is configured to condition signals communicated between antenna 611 and processing circuitry 620. Radio front end circuitry 612 may be coupled to or a part of antenna 611. In some embodiments, wireless device 610 may not include separate radio front end circuitry 612; rather, processing circuitry 620 may comprise radio front end circuitry and may be connected to antenna 611. Similarly, in some embodiments, some or all of RF transceiver circuitry 622 may be considered a part of interface 614. Radio front end circuitry 612 may receive digital data that is to be sent out to other network nodes or wireless devices via a wireless connection. Radio front end circuitry 612 may convert the digital data into a radio signal having the appropriate channel and bandwidth parameters using a combination of filters 618 and/or amplifiers 616. The radio signal may then be transmitted via antenna 611. Similarly, when receiving data, antenna 611 may collect radio signals which are then converted into digital data by radio front end circuitry 612. The digital data may be passed to processing circuitry 620. In other embodiments, the interface may comprise different components and/or different combinations of components.

Processing circuitry 620 may comprise a combination of one or more of a microprocessor, controller, microcontroller, central processing unit, DSP, ASIC, FPGA, or any other suitable computing device, resource, or combination of hardware, software, and/or encoded logic operable to provide, either alone or in conjunction with other wireless device 610 components, such as device readable medium 630, wireless device 610 functionality. Such functionality may include providing any of the various wireless features or benefits discussed herein. For example, processing circuitry 620 may execute instructions stored in device readable medium 630 or in memory within processing circuitry 620 to provide the functionality disclosed herein.

As illustrated, processing circuitry 620 includes one or more RF transceiver circuitry 622, baseband processing circuitry 624, and application processing circuitry 626. In other embodiments, the processing circuitry may comprise different components and/or different combinations of components. In certain embodiments processing circuitry 620 of wireless device 610 may comprise a SOC. In some embodiments, RF transceiver circuitry 622, baseband processing circuitry 624, and application processing circuitry 626 may be on separate chips or sets of chips. In alternative embodiments, part or all of baseband processing circuitry 624 and application processing circuitry 626 may be combined into one chip or set of chips, and RF transceiver circuitry 622 may be on a separate chip or set of chips. In still alternative embodiments, part or all of RF transceiver circuitry 622 and baseband processing circuitry 624 may be on the same chip or set of chips, and application processing circuitry 626 may be on a separate chip or set of chips. In yet other alternative embodiments, part or all of RF transceiver circuitry 622, baseband processing circuitry 624, and application processing circuitry 626 may be combined in the same chip or set of chips. In some embodiments, RF transceiver circuitry 622 may be a part of interface 614. RF transceiver circuitry 622 may condition RF signals for processing circuitry 620.

In certain embodiments, some or all of the functionality described herein as being performed by a wireless device may be provided by processing circuitry 620 executing instructions stored on device readable medium 630, which in certain embodiments may be a computer-readable storage medium. In alternative embodiments, some or all of the functionalities may be provided by processing circuitry 620 without executing instructions stored on a separate or discrete device readable storage medium, such as in a hardwired manner. In any of those embodiments, whether executing instructions stored on a device readable storage medium or not, processing circuitry 620 may be configured to perform the described functionality. The benefits provided by such functionality are not limited to processing circuitry 620 alone or to other components of wireless device 610 but are enjoyed by wireless device 610 as a whole, and/or by end users and the wireless network generally.

Processing circuitry 620 may be configured to perform any determining, calculating, or similar operations (e.g., certain obtaining operations) described herein as being performed by a wireless device. These operations, as performed by processing circuitry 620, may include processing information obtained by processing circuitry 620 by, for example, converting the obtained information into other information, comparing the obtained information or converted information to information stored by wireless device 610, and/or performing one or more operations based on the obtained information or converted information, and as a result of said processing making a determination.

Device readable medium 630 may be operable to store a computer program, software, an application including one or more of logic, rules, code, tables, etc. and/or other instructions capable of being executed by processing circuitry 620. Device readable medium 630 may include computer memory (e.g., RAM or ROM), mass storage media (e.g., a hard disk), removable storage media (e.g., CD, DVD), and/or any other volatile or non-volatile, non-transitory device readable and/or computer executable memory devices that store information, data, and/or instructions that may be used by processing circuitry 620. In some embodiments, processing circuitry 620 and device readable medium 630 may be integrated.

User interface equipment 632 may provide components that allow for a human user to interact with wireless device 610. Such interaction may be of many forms, such as visual, audial, tactile, etc. User interface equipment 632 may be operable to produce output to the user and to allow the user to provide input to wireless device 610. The type of interaction may vary depending on the type of user interface equipment 632 installed in wireless device 610. For example, if wireless device 610 is a smart phone, the interaction may be via a touch screen; if wireless device 610 is a smart meter, the interaction may be through a screen that provides usage (e.g., the number of gallons used) or a speaker that provides an audible alert (e.g., if smoke is detected). User interface equipment 632 may include input interfaces, devices and circuits, and output interfaces, devices and circuits. User interface equipment 632 is configured to allow input of information into wireless device 610 and is connected to processing circuitry 620 to allow processing circuitry 620 to process the input information. User interface equipment 632 may include, for example, a microphone, a proximity or other sensor, keys/buttons, a touch display, one or more cameras, a USB port, or other input circuitry. User interface equipment 632 is also configured to allow output of information from wireless device 610, and to allow processing circuitry 620 to output information from wireless device 610. User interface equipment 632 may include, for example, a speaker, a display, vibrating circuitry, a USB port, a headphone interface, or other output circuitry. Using one or more input and output interfaces, devices, and circuits, of user interface equipment 632, wireless device 610 may communicate with end users and/or the wireless network and allow them to benefit from the functionality described herein.

Auxiliary equipment 634 is operable to provide more specific functionality which may not be generally performed by wireless devices. This may comprise specialized sensors for performing measurements for various purposes, interfaces for additional types of communication such as wired communications etc. The inclusion and type of components of auxiliary equipment 634 may vary depending on the embodiment and/or scenario.

Power source 636 may, in some embodiments, be in the form of a battery or battery pack. Other types of power sources, such as an external power source (e.g., an electricity outlet), photovoltaic devices or power cells, may also be used. The wireless device 610 may further comprise power circuitry 637 for delivering power from power source 636 to the various parts of wireless device 610 which need power from power source 636 to carry out any functionality described or indicated herein. Power circuitry 637 may in certain embodiments comprise power management circuitry. Power circuitry 637 may additionally or alternatively be operable to receive power from an external power source; in which case wireless device 610 may be connectable to the external power source (such as an electricity outlet) via input circuitry or an interface such as an electrical power cable. Power circuitry 637 may also, in certain embodiments, be operable to deliver power from an external power source to power source 636. This may be, for example, for the charging of power source 636. Power circuitry 637 may perform any formatting, converting, or other modification to the power from power source 636 to make the power suitable for the respective components of wireless device 610 to which power is supplied.

Figure 7:
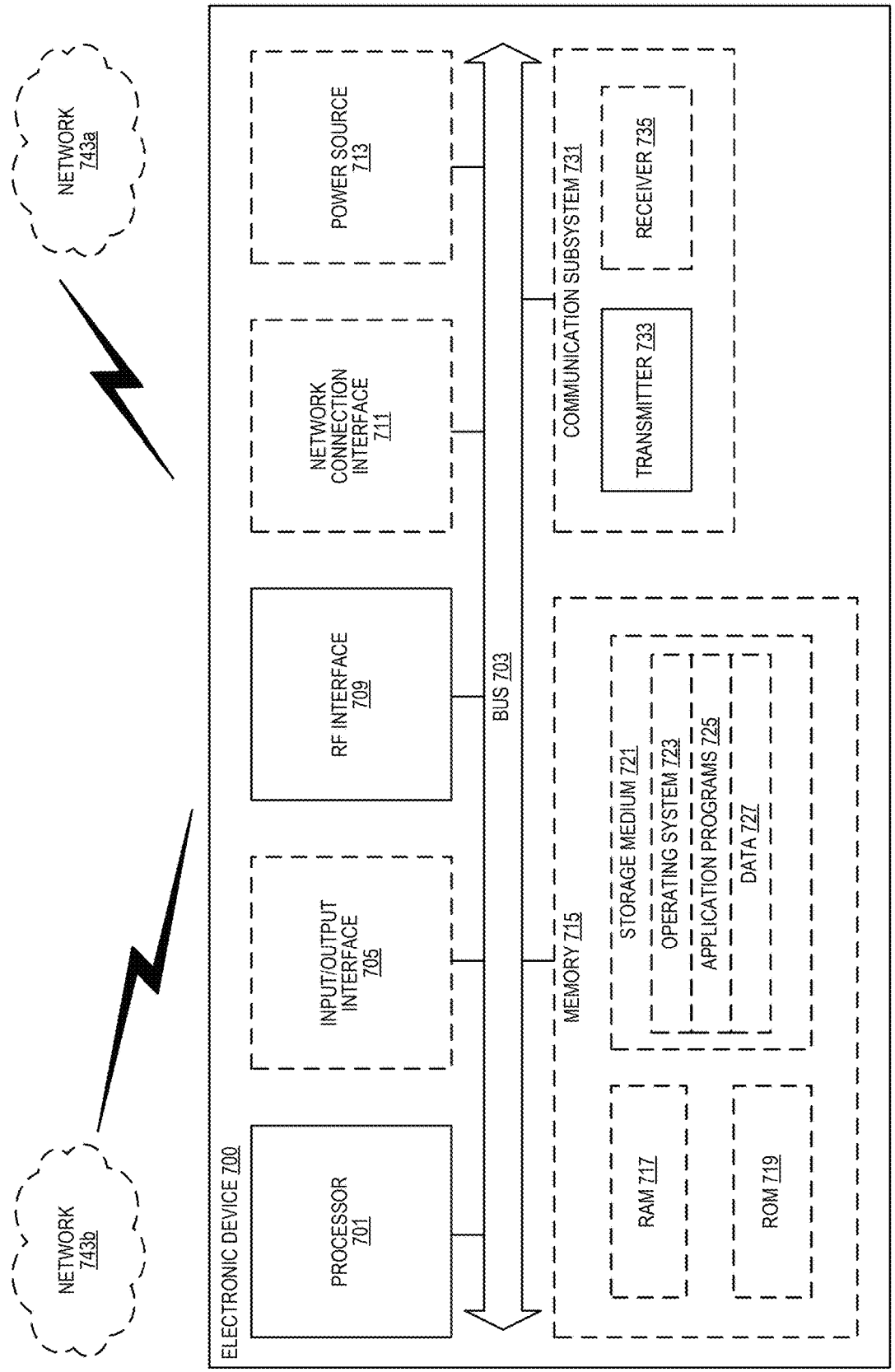
FIG. 7 illustrates one embodiment of an electronic device in accordance with various aspects as described herein.

FIG. 7 illustrates one embodiment of an electronic device 700 in accordance with various aspects described herein. As used herein, device 700 can be a wired device, wireless device or both. Further, device 700 may not necessarily have a user in the sense of a human user who owns and/or operates the relevant device. Instead, device 700 may represent a device that is intended for sale to, or operation by, a human user but which may not, or which may not initially, be associated with a specific human user (e.g., a smart sprinkler controller, IoT device). Alternatively, device 700 may represent a device that is not intended for sale to, or operation by, an end user but which may be associated with or operated for the benefit of a user (e.g., a smart power meter). Device 700 may be UE identified by the 3GPP, including a NB-IoT UE, a machine type communication (MTC) UE, and/or an enhanced MTC (eMTC) UE. Device 700, as illustrated in FIG. 7, is one example of a device configured for wired or wireless communication in accordance with one or more communication standards such as promulgated by the 3GPP, such as 3GPP's GSM, UMTS, LTE, and/or 5G standards.

Device 700 can include any electronic device that has an amplifier. In one example, device 700 can include an audio or music device, home audio system, stereo amplifier, audio or video receiver, home theater system, powered speaker, subwoofer, karaoke machine, musical equipment, guitar amplifier, bass amplifier, keyboard amplifier, public address system, studio monitor, headphone or earbud, noise-canceling headphone, portable audio device, Bluetooth speaker, portable amplifier for headphones or instrument, or the like. In another example, device 700 can include a wireless device, user equipment, network node, base station, broadcast or communication device, radio transmitter, wireless communication equipment, satellite communication system, Wi-Fi router, extended range device, telecommunication device, microwave repeater, radar system, or the like. In yet another example, device 700 can include consumer electronics, televisions, internal audio amplifier for a speaker, external soundbar with built-in amplifier, computer or gaming device, sound card with integrated amplifier, DAC with amplifier, smartphone, tablet, built-in audio amplifier for speaker or headphone, or the like. In yet another example, device 700 can include automotive or transportation device, car audio system, car amplifier, subwoofer amplifier, marine audio system, amplifier for boat or watercraft, aircraft communication system, amplifier for cockpit communication or in-flight entertainment, or the like. In yet another example, device 700 can include industrial and professional equipment, public address system, amplifier for a large venue, school or stadium, concert or event equipment, power amplifier for a loudspeaker, line array system, medical equipment, ultrasound machine, hearing aids, or the like. In yet another example, device 700 can include RF or specialized equipment, RF amplifier, signal booster for a cell tower, satellite uplink or downlink device, test or measurement instrument, oscilloscope, spectrum analyzer, military or aerospace equipment, radar system, communication jammer, or the like. In yet another example, device 700 can include toy or hobby device, radio-controlled car, plane or drone, smart home device, smart speaker, voice assistant device, or the like.

In FIG. 7, device 700 includes processing circuitry 701 that is operatively coupled to input/output interface 705, RF interface 709, network connection interface 711, memory 715 including RAM 717, ROM 719, and storage medium 721 or the like, communication subsystem 731, power source 713, and/or any other component, or any combination thereof. Storage medium 721 includes operating system 723, application program 725, and data 727. In other embodiments, storage medium 721 may include other similar types of information. Certain electronic devices may utilize all of the components shown in FIG. 7, or only a subset of the components. The level of integration between the components may vary from one device to another device. Further, certain electronic devices may contain multiple instances of a component, such as multiple processors, memories, transceivers, transmitters, receivers, etc.

In FIG. 7, processing circuitry 701 may be configured to process computer instructions and data. Processing circuitry 701 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or DSP, together with appropriate software; or any combination of the above. For example, the processing circuitry 701 may include two central processing units (CPUs). Data may be information in a form suitable for use by a computer.

In the depicted embodiment, input/output interface 705 may be configured to provide a communication interface to an input device, output device, or input and output device. Device 700 may be configured to use an output device via input/output interface 705. An output device may use the same type of interface port as an input device. For example, a USB port may be used to provide input to and output from device 700. The output device may be a speaker, a sound card, a video card, a display, a monitor, a printer, an actuator, an emitter, a smartcard, another output device, or any combination thereof. Device 700 may be configured to use an input device via input/output interface 705 to allow a user to capture information into device 700. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, or an optical sensor.

In FIG. 7, RF interface 709 may be configured to provide a communication interface to RF components such as a transmitter, a receiver, and an antenna. Network connection interface 711 may be configured to provide a communication interface to network 743a. Network 743a may encompass wired and/or wireless networks such as a local-area network (LAN), a wide-area network (WAN), a computer network, a wireless network, a telecommunications network, another like network or any combination thereof. For example, network 743a may comprise a Wi-Fi network. Network connection interface 711 may be configured to include a receiver and a transmitter interface used to communicate with one or more other devices over a communication network according to one or more communication protocols, such as Ethernet, TCP/IP, synchronous optical networking (SONET), asynchronous transfer mode (ATM), or the like. Network connection interface 711 may implement receiver and transmitter functionality appropriate to the communication network links (e.g., optical, electrical, and the like). The transmitter and receiver functions may share circuitry components, software or firmware, or alternatively may be implemented separately.

RAM 717 may be configured to interface via bus 702 to processing circuitry 701 to provide storage or caching of data or computer instructions during the execution of software programs such as the operating system, application programs, and device drivers. ROM 719 may be configured to provide computer instructions or data to processing circuitry 701. For example, ROM 719 may be configured to store invariant low-level system code or data for basic system functions such as basic input and output (I/O), startup, or reception of keystrokes from a keyboard that are stored in a non-volatile memory. Storage medium 721 may be configured to include memory such as RAM, ROM, programmable ROM (PROM), erasable PROM (EPROM), electrically erasable PROM (EEPROM), magnetic disks, optical disks, floppy disks, hard disks, removable cartridges, or flash drives. In one example, storage medium 721 may be configured to include operating system 723, application program 725 such as a web browser application, a widget or gadget engine or another application, and data file 727. Storage medium 721 may store, for use by device 700, any of a variety of various operating systems or combinations of operating systems.

Storage medium 721 may be configured to include a number of physical drive units, such as redundant array of independent disks (RAID), floppy disk drive, flash memory, USB flash drive, external hard disk drive, thumb drive, pen drive, key drive, high-density DVD (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium 721 may allow device 700 to access computer-executable instructions, application programs or the like, stored on transitory or non-transitory memory media, to off-load data, or to upload data. An article of manufacture, such as one utilizing a communication system may be tangibly embodied in storage medium 721, which may comprise a device readable medium.

In FIG. 7, processing circuitry 701 may be configured to communicate with network 743b using communication subsystem 731. Network 743a and network 743b may be the same network or networks or different network or networks. Communication subsystem 731 may be configured to include one or more transceivers used to communicate with network 743b. For example, communication subsystem 731 may be configured to include one or more transceivers used to communicate with one or more remote transceivers of another device capable of wireless communication such as another electronic device, wireless device, UE, or base station of a radio access network (RAN) according to one or more communication protocols, such as IEEE 702.11, CDMA, WCDMA, GSM, LTE, UMTS terrestrial radio access network (UTRAN), WiMax, or the like. Each transceiver may include transmitter 733 and/or receiver 735 to implement transmitter or receiver functionality, respectively, appropriate to the RAN links (e.g., frequency allocations and the like). Further, transmitter 733 and receiver 735 of each transceiver may share circuitry components, software or firmware, or alternatively may be implemented separately.

In the illustrated embodiment, the communication functions of communication subsystem 731 may include data communication, voice communication, multimedia communication, short-range communications such as Bluetooth, near-field communication, location-based communication such as the use of the global positioning system (GPS) to determine a location, another like communication function, or any combination thereof. For example, communication subsystem 731 may include cellular communication, Wi-Fi communication, Bluetooth communication, and GPS communication. Network 743b may encompass wired and/or wireless networks such as a LAN, a WAN, a computer network, a wireless network, a telecommunications network, another like network or any combination thereof. For example, network 743b may be a cellular network, a Wi-Fi network, and/or a near-field network. Power source 713 may be configured to provide alternating current (AC) or direct current (DC) power to components of device 700.

The features, benefits and/or functions described herein may be implemented in one of the components of device 700 or partitioned across multiple components of device 700. Further, the features, benefits, and/or functions described herein may be implemented in any combination of hardware, software or firmware. In one example, communication subsystem 731 may be configured to include any of the components described herein. Further, processing circuitry 701 may be configured to communicate with any of such components over bus 702. In another example, any of such components may be represented by program instructions stored in memory that when executed by processing circuitry 701 perform the corresponding functions described herein. In another example, the functionality of any of such components may be partitioned between processing circuitry 701 and communication subsystem 731. In another example, the non-computationally intensive functions of any of such components may be implemented in software or firmware and the computationally intensive functions may be implemented in hardware. The embodiments described by this disclosure can be implemented for the device 700 in the RF interface block 709 or the transmitter block 733 of the communication subsystem 731.

Those skilled in the art will also appreciate that embodiments herein further include corresponding computer programs.

A computer program comprises instructions which, when executed on at least one processor of an apparatus, cause the apparatus to carry out any of the respective processes described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of an apparatus, cause the apparatus to perform as described above.

Embodiments further include a computer program product comprising program code portions for performing the steps of any of the embodiments herein when the computer program product is executed by a computing device. This computer program product may be stored on a computer readable recording medium.

Additional embodiments will now be described. At least some of these embodiments may be described as applicable in certain contexts for illustrative purposes, but the embodiments are similarly applicable in other contexts not explicitly described.

In one exemplary embodiment, a method of performing decomposition of signals into a sum of truncated Fourier series includes: receiving samples of an input signal and reference clock signals; computing the amplitude and phase of each sample of input signal; restricting to a finite alphabet the possible amplitude value of samples by a quantization with N bits when input signal assumes any value over a dynamic range: decomposing in a mapper with N mapping components the amplitude or the quantized amplitude of the sample as a sum of N values and generating N periodic mapping coefficients according to a mapping table that activate and deactivate periodic mapping components; generating N periodic mapping components or N pairs of in-phase and quadrature periodic mapping components with amplitudes with amplitudes according to a mapping table provided by the mapper; truncating time duration of each periodic mapping component; multiplying each truncated periodic mapping by the corresponding mapping coefficients; or amplifying all active truncated periodic mapping components.

In another exemplary embodiment, the reference clock signals include a sample rate of the input signal $f_s$, a carrier frequency $f_c$ and/or a clock signal with an intermediate frequency $f_i$.

In another exemplary embodiment, the reference clock signals include a sample rate of the input signal $f_s$.

In another exemplary embodiment, the method further includes receiving an input signal includes receiving the samples of baseband signal or receiving the samples of the complex envelope or envelope of a bandpass signal or receiving a baseband signal or a bandpass signal and sampling it in a sampling circuitry or a sample and hold circuitry to generate the samples of the input signal.

In another exemplary embodiment, truncated periodic components are baseband or bandpass components.

In another exemplary embodiment, when received samples of a complex envelope or samples of an envelope of a bandpass signal, the multiplication of truncated periodic mapping components by corresponding mapping coefficients further includes upconverting truncated periodic in-phase and quadrature mapping components to carrier frequency $f_c$ and adding the in-phase and quadrature truncated periodic mapping components.

In another exemplary embodiment, when received samples of a complex envelope or samples of an envelope of a bandpass signal, the multiplication of truncated periodic mapping components by corresponding mapping coefficients further includes upconverting truncated periodic in-phase and quadrature mapping components to intermediate frequency $f_i$, adding the in-phase and quadrature truncated periodic mapping components and upconverting bandpass truncated periodic mapping components to carrier frequency $f_c$.

In another exemplary embodiment, the quantization further includes the computation of quantization error and its quantization to obtain a quantized value of the quantization error and a weighted compensation of quantization error on the mapping components.

In another exemplary embodiment, quantization, mapping, periodic components generation, time truncation and generation of mapping coefficients that activate or deactivate periodic truncated components are performed in a single digital block.

In another exemplary embodiment, mapping, periodic components generation, time truncation and generation of mapping coefficients that activate or deactivate periodic truncated components are performed in a single digital block.

In another exemplary embodiment, truncated periodic components are baseband or bandpass components and each baseband truncated periodic mapping component, or each bandpass truncated periodic component is amplified and transmitted without performing a sum of all amplified components.

In another exemplary embodiment, an apparatus includes an input circuitry receiving as input signal the samples of a baseband signal or of a bandpass signal or the samples of complex envelope of a bandpass signal and a set of reference clock signals; a processing block circuitry with quantizers and a mapper that computes amplitude and phase of each sample and uses a quantizer when input signal assumes any value over a dynamic range to restrict to a finite alphabet the possible values of the samples and computes quantization error $Q_E$ and uses a second quantizer to quantize $Q_E$ of first quantizer as $Q_{EQ}$, and the mapper decomposes the sample as a sum of periodic mapping components and generates mapping coefficients according to a mapping table that activate and deactivate periodic mapping components; a generator of periodic mapping components that generates periodic mapping components according mapping coefficients and mapping table of the mapper; a circuitry block that truncates time duration of each periodic mapping component; a circuitry that multiplies each truncated periodic mapping by the corresponding mapping coefficients; an output block circuitry with an upconverter circuitry, a set of DACs or mixers, and a set of power DACs or amplifiers that amplify the bandpass truncated periodic components with outputs connected to combiner circuitries or matching networks or transducers; or an output block circuitry with a set of amplifiers that amplify truncated periodic components with outputs connected to combiner circuitries or matching networks or transducers.

In another exemplary embodiment, input circuitry includes a sampling circuitry to sample the input signal.

In another exemplary embodiment, the set of reference clock signals include a reference clock signal with sample rate of the input signal $f_s$, a reference clock signal with a carrier frequency $f_c$ and/or a reference clock signal with an intermediate frequency $f_i$.

In another exemplary embodiment, second quantizer receives the quantization error $Q_E$ from first quantizer and quantizes it to generate a quantized quantization error $Q_{EQ}$ to be used at the mapper.

In another exemplary embodiment, mapper performs a weighted sum of the quantized version of quantization error on the amplitudes of periodic mapping components.

In another exemplary embodiment, processing block circuitry do not have quantizers.

In another exemplary embodiment, the mapper computes the set of N of pairs of mapping coefficients.

In another exemplary embodiment, both quantizer and mapper have several Look up tables with different quantization and mapping rules needed to generate different sets of periodic mapping components associated with different baseband or bandpass signals.

In another exemplary embodiment, quantizer, mapper and generator of periodic mapping components are implemented in a single digital/analog block.

In another exemplary embodiment, input circuitry receives as input signal the samples $S_{bbs}(t_s)=S_{bbs}=A_{ks}$ of a baseband signal assuming any value over a dynamic range; input circuitry receives clock reference signals with a fundamental frequency for the periodic components in which each sample is decomposed and with a reference clock signal with sample rate $f_s$ of the input signal; a quantizer of N bits in processing block circuitry quantizes $A_{ks}$ as $A_{qks}$, to limit the set of possible values to alphabets with dimension of $2^N$ values, computes quantization error $Q_E$ and uses a second quantizer to quantize $Q_E$ of first quantizer as $Q_{EQ}$ that is used by the mapper to perform a weighted sum of the quantized version of quantization error to the amplitudes of periodic components; the mapper decomposes $A_{qks}$ as a sum $$A_{qks} = \sum_{i=1}^{N} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, \ldots, A_N\}$ and related with periodic components with same amplitude; the mapper computes the set of N mapping coefficients $C_{I,ik}$ which are used to activate and truncate periodic mapping components, performs a weighted sum of the quantized version of quantization error to the amplitudes of periodic components and provides info about quantization components and mapping coefficients to circuitry that generates the periodic mapping components; a circuitry that generates periodic components given by $$s_{I,T_o}^{(i)}(t) = \sum_{n=-\infty}^{\infty} c_{I,n}^{(i)} \exp(j2\pi n f_0 t)$$

in which each quantized amplitude is decomposed, where coefficients $c_{I,n}^{(i)}$ are related with the periodic components with amplitude $A_i$; an activation and time truncation block circuitry that uses the coefficients $C_{I,ik}$ together the sampling pulse duration $T_s$ and pulse $r(t)$ to activate and time truncate periodic mapping components $$s_{I,T_o}^{(i)}(t)$$

and generate N' active truncated versions of these signals given by $$s_{Ik}^{(i)}(t) = [C_{I,ik} s_{I,T_o}^{(i)}(t)] r(t - mT_s);$$

or an output block circuitry with a set of amplifiers, combiners or matching networks or transducers connected to the amplifier's outputs.

In another exemplary embodiment, input circuitry receives as input signal the samples $S_{bbs}(t_s)=S_{bbs}=A_{ks}$ of a baseband signal, where samples have a finite set of amplitudes; input circuitry receives clock reference signals with a fundamental frequency for the periodic components in which each sample is decomposed and with a reference clock signal with sample rate $f_s$ of the input signal; the mapper decomposes $A_{ks}$ as a sum $$A_{ks} = \sum_{i=1}^{N} C_{I,ik} A_i,$$

with $$c_{ik} = \begin{cases} \pm 1 \\ 0 \end{cases},$$

and amplitudes $A_i$ belonging to a finite alphabet $A_i \in \{A_1, \ldots, A_N\}$ and related with periodic components with same amplitude; or the mapper computes the set of N mapping coefficients $C_{I,ik}$, which are used to activate and truncate periodic mapping components, and provides info about quantization components and mapping coefficients to circuitry that generates the periodic mapping components.

In another exemplary embodiment, the output block circuitry: receives as input N' active truncated periodic mapping components; N' active truncated periodic mapping components are delivered to a set of N amplifiers with outputs of the N' active amplifiers given by $g_a{}^i s'_k{}^{(i)}$, where $g_a{}^i$ denotes the amplifier gain of the amplifier associated with the i-th component; a combiner or a matching network circuitry combines the outputs of the N' active amplifiers or a set of transducers is connected to the outputs of amplifiers.

In another exemplary embodiment, input circuitry receives as input signal the samples $\tilde{S}_s$ of a complex envelope given by $$\tilde{S}_S = \tilde{S}(t_s) = S_{Iks} + jS_{Qks},$$

with $$S_{Iks} = E_{ks}\cos(\alpha_{ks}) = A_{ks}$$

and $$S_{Qks} = E_{ks}\cos(\alpha_{ks}) = B_{ks},$$

where $$E_{ks} = \sqrt{S_{Iks}^2 + S_{Qks}^2} = \sqrt{A_{ks}^2 + B_{ks}^2}$$

and $a_{ks}=\arctan(S_{Qks}/S_{Iks})$; input circuitry receives reference clock signals with a fundamental frequency for the periodic components in which each sample is decomposed, with a reference clock with the intermediate, a reference clock with carrier frequency and a reference clock signal with sample rate $f_s$ of the input signal; a processing circuitry composed by a quantizer of N bits and a mapper that computes $E_{ks}$, $A_{ks}$ and $B_{ks}$, and quantizes as $A_{qks}$, $B_{qks}$ and $E_{qks}$, to limit the set of possible values to alphabets with dimension of $2^N$ values, computes quantization error $Q_E$ and uses a second quantizer to quantize $Q_E$ of first quantizer as Quo that is used by the mapper to perform a weighted sum of the quantized version of quantization error to the amplitudes of periodic components; the mapper decomposes $A_{qks}$ as a sum $$A_{qks} = \sum_{i=1}^{N_b} C_{I,ik} A_i,$$

with $$C_{I,ik} = \begin{cases} \pm 1 \\ 0 \end{cases},$$

and amplitudes $A_i$ belonging to a finite alphabet $A_i \in \{A_1, \ldots, A_N\}$, decomposes $B_{qks}$ as a sum $$B_{qks} = \sum_{i=1}^{N_b} C_{Q,ik} B_i$$

with $$C_{Q,ik} = \begin{cases} \pm 1 \\ 0 \end{cases}$$

and amplitudes $B_i$ belonging to a finite alphabet $B_i \in \{B_1, \ldots, B_{N_b}\}$ and decomposes $E_{qks}$ as $$E_{qks} = \sum_{i=1}^{N_b} C_{ik} E_i,$$

with $$C_{ik} = \begin{cases} \pm 1 \\ 0 \end{cases},$$

and amplitudes $E_i$ belonging to a finite alphabet $E_i \in \{E_1, \ldots, E_{N_b}\}$, computes the set of $N_b$ of coefficients $C_{I,ik}$, $C_{Q,ik}$ and $C_{ik}$ which are used to activate and truncate periodic components, performs a weighted sum of the quantized version of quantization error to the amplitudes of periodic components and provides info about quantization components and mapping coefficients to circuitry that generates the periodic mapping components; a circuitry that generates periodic components given by $$s_{I,T_o}^{(i)}(t) = \sum_{n=-\infty}^{\infty} c_{I,n}^{(i)} \exp(j2\pi n f_0 t)$$

and $$s_{QT_o}^{(i)}(t) = \sum_{n=-\infty}^{\infty} c_{Q,n}^{(i)} \exp(j2\pi n f_0 t)$$

in which each quantized amplitude of the in-phase and quadrature components is decomposed, where coefficients $c_{I,n}^{(i)}$ and $c_{Q,n}^{(i)}$ are related with the periodic components with amplitude $A_i$ and $B_i$, respectively; an activation and time truncation block circuitry that uses the coefficients $C_{I,ik}$, $C_{Q,ik}$ or $C_{ik}$ together the sampling pulse duration $T_s$ and pulse r(t) to activate and time truncate periodic $s_{I,T_0}^{(i)}(t)$ components and generate $N_b$ truncated versions of these signals given by $$s_{Ik}^{(i)}(t) = \left[C_{I,ik} s_{I,T_o}^{(i)}(t)\right] r(t - mT_s),$$

$$s_{Qk}^{(i)}(t) = \left[C_{Q,ik} s_{QT_o}^{(i)}(t)\right] r(t - mT_s) \text{ and } s_k^{(i)}(t) = \left[C_{ik} s_{T_o}^{(i)}(t)\right] e^{j\alpha_{ks}} r(t - mT_s),$$

respectively; or an output block circuitry includes an upconverter circuitry with a set of DACs or mixers, power DACs or amplifiers, combiners or matching networks or transducers.

In another exemplary embodiment, activation and time truncation block circuitry, uses the coefficients $C_{ik}$ together the sampling pulse duration $T_s$ and pulse r(t) to activate N' time truncated periodic components and generate the N truncated versions of these signals given by $$s_k^{(i)}(t) = \left[C_{ik} s_{T_o}^{(i)}(t)\right] e^{j\alpha_{ks}} r(t - mT_s).$$

In another exemplary embodiment, the processing circuitry, mapper and generator of periodic mapping components are implemented in a single digital/analog block.

In another exemplary embodiment, input signal is the samples of a complex envelope $\tilde{S}(t)$ of bandpass signal with a finite alphabet of amplitudes or a discrete and finite alphabet of amplitudes; processing block has a mapper that computes $E_{ks}$, $A_{ks}$ and $B_{ks}$, and decomposes $E_{ks}$ or $A_{ks}$ and $B_{ks}$ and according to a mapping table decomposes $A_{ks}$ as a sum $$A_{ks} = \sum_{i=1}^{N} C_{I,ik} A_i, \text{ with } C_{I,ik} = \begin{cases} \pm 1 \\ 0 \end{cases},$$

and amplitudes $A_i$ belonging to a finite alphabet $A_i \in \{A_1, \ldots, A_N\}$, decomposes $B_{ks}$ as a sum $$B_{ks} = \sum_{i=1}^{N} C_{Q,ik} B_i$$

with $$C_{Q,ik} = \begin{cases} \pm 1 \\ 0 \end{cases}$$

and amplitudes $B_i$ belonging to a finite alphabet $B_i \in \{B_1, \ldots, B_N\}$ and decomposes the computed value $E_{ks}$ of the sample amplitude as $$E_{ks} = \sum_{i=1}^{N} C_{ik} E_i,$$

with $$C_{ik} = \begin{cases} \pm 1 \\ 0 \end{cases},$$

and amplitudes $E_i$ belonging to a finite alphabet $E_{=i} \in \{E_1, \ldots, E_N\}$, computes the set of $N_b$ of coefficients $C_{I,ik}$, $C_{Q,ik}$ and $C_{ik}$ which are used to activate and truncate periodic components, and provides info about quantization components and mapping coefficients to circuitry that generates the periodic mapping components; activation and time truncation block circuitry uses the coefficients $C_{I,ik}$, $C_{Q,ik}$ or $C_{ik}$ together the sampling pulse duration $T_s$ and pulse $r(t)$ to activate and time truncate periodic $s_{I,T_o}^{(i)}(t)$ components and generate N truncated versions of these signals given by $$s_{Ik}^{(i)}(t) = [C_{I,ik} s_{I,T_o}^{(i)}(t)] r(t - mT_s), s_{Qk}^{(i)}(t) = [C_{Q,ik} s_{QT_o}^{(i)}(t)] r(t - mT_s)$$

and $$s_k^{(i)}(t) = [C_{ik} s_{T_o}^{(i)}(t)] e^{j\alpha_{ks}} r(t - mT_s),$$

respectively.

In another exemplary embodiment, the output block circuitry: receives a reference clock signals with the carrier frequency $f_c$; upconverter circuitry multiplies active truncated signals $\cos(2\pi f_c t)$ and $-\sin(2\pi f_c t)$ to generate a set of N' active signals given by $$s_{Ik}'^{(i)} = s_{Ik}^{(i)}(t) \cos(2\pi f_c t)$$

$$s_{Qk}'^{(i)} = -s_{Qk}^{(i)}(t)$$

$\sin(2\pi f_c t)$ and sums active signals of $s'_{Ik}{}^{(i)}$ and $s'_{Qk}{}^{(i)}$ to generate bandpass truncated periodic components at carrier frequency given by $$s_k'^{(i)} = s_{Ik}'^{(i)} + s_{Qk}'^{(i)};$$

a circuitry with a set of amplifiers amplifies each bandpass truncated periodic components; or a combiner or matching impedance network that combines amplified bandpass truncated periodic mapping components.

In another exemplary embodiment, the output block circuitry: receives a reference clock signals with the carrier frequency $f_c$; N' active truncated signals are provided to a set of DACs that generate a set of N' active among the N possible ones signals given by $$s_k'^{(i)} = s_{Ik}^{(i)}(t) \cos(2\pi f_c t) - s_{Qk}^{(i)}(t) \sin(2\pi f_c t), , i = 1, \ldots, N;$$

or N' active signals $s'_k{}^{(i)}$ are supplied to a set of amplifiers, and the amplified components are combined as the sum of N' bandpass truncated periodic components.

In another exemplary embodiment, the output block circuitry: receives reference clock signals with the carrier frequency $f_c$ and the intermediate frequency $f_i$; N' active truncated signals among the N possible ones are provided to a set of DACs to generate a set of N' active signals among the possible ones given by $$s_k'^{(i)} = s_{Ik}^{(i)}(t) \cos(2\pi f_i t) - s_{Qk}^{(i)}(t) \sin(2\pi f_i t), i = 1, \ldots, N; N'$$

active signals among $$s_k'^{(i)}(i), i = 1, \ldots, N$$

are provided to a set of mixers to upconvert periodic components to carrier frequency; up converted signals are provided to a set of amplifiers that amplify each component; or outputs of the amplifiers are the inputs of a combiner or matching network that generate a bandpass signal as the sum of N' active bandpass periodic truncated components or outputs of the amplifiers are inputs of a set of transducers.

In another exemplary embodiment, the output block circuitry: N' active truncated signals among the N possible ones are multiplied in mixers by cos ($2\pi f_c t$) and $-\sin$ ($2\pi f_c t$) to generate a set of N' active signals among the possible ones given by $$s'^{(i)}_{Ik} = s^{(i)}_{Ik}(t)\cos(2\pi f_c t)$$

and $$s'^{(i)}_{Qk} = -s^{(i)}_{Qk}(t)\sin(2\pi f_c t); N'$$

active signals are summed to generate the truncated periodic components at carrier frequency given by $$s'^{(i)}_k = s'^{(i)}_{Ik} + s'^{(i)}_{Qk};$$

a set of amplifiers where each amplifier amplifies each component; outputs of the amplifiers are the inputs of a combiner or matching impedance network circuitry that combines the amplified components given by $$g_a^i s'_k(i),$$

where $g_a^i$ denotes the amplifier gain of the amplifiers associated with the i-th component or outputs of the amplifiers are the inputs of a circuitry with transducers.

In another exemplary embodiment, the output block circuitry: N' active truncated signals among the N possible ones are multiplied in a set of mixers by cos ($2\pi f_i t$) and $-\sin$ ($2\pi f_i t$) to generate a set of N' active signals given by $$s'_k(i) = s^{(i)}_{Ik}(t)\cos(2\pi f_i t) - s^{(i)}_{Qk}(t)\sin(2\pi f_i t); N'$$

active signals among $$s'^{(i)}_k, i = 1, \ldots, N$$

are provided to a set of mixers to upconvert periodic components to carrier frequency $f_c$; up converted signals are provided to a set of amplifiers that amplify each component; or outputs of the amplifiers are combined as the sum of N' active bandpass periodic truncated components.

In another exemplary embodiment, pulse shaping and spectral mask are defined by the sets of Fourier coefficients related with the periodic mapping components and the shape of the pulse r(t).

In one exemplary embodiment, a method includes outputting, by a circuitry, a set of truncated periodic components that collectively represents a sample of an input signal having information and amplifying, by a set of power amplifier circuitry electrically coupled to the circuitry, the set of truncated periodic components that collectively represents an amplified sample of the input signal.

In another exemplary embodiment, the method can include computing an amplitude and a phase of the sample, quantizing the amplitude to obtain a set of quantization bits that represents the quantized amplitude of the sample, or decomposing the set of quantization bits that represents the quantized amplitude of the sample to obtain a set of periodic component activation indications that indicates which of a set of periodic components is activated or deactivated.

In another exemplary embodiment, the method can include generating a set of periodic components based on a set of quantization bits that represents the quantized amplitude of the sample and a set of periodic component activation indications that indicates which of a set of periodic components is activated or deactivated.

In another exemplary embodiment, the method can include truncating a set of periodic components to a certain sample period to obtain the set of truncated periodic components.

In another exemplary embodiment, the method can include amplifying, by the set of power amplifier circuitry, the set of periodic components to obtain a set of amplified periodic components or combining the set of amplified periodic components to obtain an output signal.

In another exemplary embodiment, a user equipment device includes a circuitry operable to output a set of truncated periodic components that collectively represents a sample of an input signal having information and a set of power amplifier circuitry electrically coupled to the circuitry and operable to amplify the set of truncated periodic components that collectively represents an amplified sample of the input signal.

In another exemplary embodiment, the device can further include a first circuitry operable to compute an amplitude and a phase of the sample, a second circuitry operable to quantize the amplitude to obtain a set of quantization bits that represents the quantized amplitude of the sample, or a mapper circuitry operable to decompose the set of quantization bits that represents the quantized amplitude of the sample to obtain a set of periodic component activation indications that indicates which of a set of periodic components is activated or deactivated.

In another exemplary embodiment, the device can further include a generator circuitry operable to generate a set of periodic components based on a set of quantization bits that represents the quantized amplitude of the sample and a set of periodic component activation indications that indicates which of a set of periodic components is activated or deactivated.

In another exemplary embodiment, the device can further include a truncation circuitry operable to truncate a set of periodic components to a certain sample period to obtain the set of truncated periodic components.

In another exemplary embodiment, the set of power amplifier circuitry can be further operable to amplify the set of periodic components to obtain a set of amplified periodic components. The device can further include a combiner circuitry operable to combine the set of amplified periodic components to obtain an output signal.

In one exemplary embodiment, a method includes amplifying, by a set of power amplifier circuitry, a set of truncated periodic components that collectively represents an amplified sample of an input signal having information.

In one exemplary embodiment, a user equipment device includes a set of power amplifier circuitry operable to amplify a set of truncated periodic components that collectively represents an amplified sample of an input signal having information.

The previous detailed description is merely illustrative in nature and is not intended to limit the present disclosure, or the application and uses of the present disclosure. Furthermore, there is no intention to be bound by any expressed or implied theory presented in the preceding field of use, background, summary, or detailed description. The present disclosure provides various examples, embodiments and the like, which may be described herein in terms of functional or logical block elements. The various aspects described herein are presented as methods, devices (or apparatus), systems, or articles of manufacture that may include a number of components, elements, members, modules, nodes, peripherals, or the like. Further, these methods, devices, systems, or articles of manufacture may include or not include additional components, elements, members, modules, nodes, peripherals, or the like.

Furthermore, the various aspects described herein may be implemented using standard programming or engineering techniques to produce software, firmware, hardware (e.g., circuits), or any combination thereof to control a computing device to implement the disclosed subject matter. It will be appreciated that some embodiments may be comprised of one or more generic or specialized processors such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the methods, devices and systems described herein. Alternatively, some or all functions could be implemented by a state machine that has no stored program instructions, or in one or more application specific integrated circuits (ASICs), in which each function or some combinations of certain of the functions are implemented as custom logic circuits. Of course, a combination of the two approaches may be used. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The term "article of manufacture" as used herein is intended to encompass a computer program accessible from any computing device, carrier, or media. For example, a computer-readable medium may include: a magnetic storage device such as a hard disk, a floppy disk or a magnetic strip; an optical disk such as a CD or DVD; a smart card; and a flash memory device such as a card, stick or key drive. Additionally, it should be appreciated that a carrier wave may be employed to carry computer-readable electronic data including those used in transmitting and receiving electronic data such as electronic mail (e-mail) or in accessing a computer network such as the Internet or a LAN. Of course, a person of ordinary skill in the art will recognize many modifications may be made to this configuration without departing from the scope or spirit of the subject matter of this disclosure.

Throughout the specification and the embodiments, the following terms take at least the meanings explicitly associated herein, unless the context clearly dictates otherwise. Relational terms such as "first" and "second," and the like may be used solely to distinguish one entity or action from another entity or action without necessarily requiring or implying any actual such relationship or order between such entities or actions. The term "or" is intended to mean an inclusive "or" unless specified otherwise or clear from the context to be directed to an exclusive form. Further, the terms "a," "an," and "the" are intended to mean one or more unless specified otherwise or clear from the context to be directed to a singular form. The term "include" and its various forms are intended to mean including but not limited to. References to "one embodiment," "an embodiment," "example embodiment," "various embodiments," and other like terms indicate that the embodiments of the disclosed technology so described may include a particular function, feature, structure, or characteristic, but not every embodiment necessarily includes the particular function, feature, structure, or characteristic. Further, repeated use of the phrase "in one embodiment" does not necessarily refer to the same embodiment, although it may. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. A device or structure that is "configured" in a certain way is configured in at least that way, but may also be configured in ways that are not listed.

What is claimed is:

1. A method, comprising:
generating, by a circuitry, a set of periodic components based on a set of quantization bits that represents a quantized amplitude of a sample of an input signal having information and a set of periodic component activation indications that indicates which of the set of periodic components is activated or deactivated;
outputting, by the circuitry, a set of truncated periodic components that collectively represents the input signal sample; and
amplifying, by a set of power amplifier circuitry electrically coupled to the circuitry, the set of truncated periodic components that collectively represents an amplified sample of the input signal.

2. The method of claim 1, further comprising:
computing an amplitude and a phase of the sample;
quantizing the amplitude to obtain the set of quantization bits that represents the quantized amplitude of the sample; and
decomposing the set of quantization bits that represents the quantized amplitude of the sample to obtain the set of periodic component activation indications that indicates which of the set of periodic components is activated or deactivated.

3. The method of claim 1, further comprising:
truncating the set of periodic components to a certain sample period to obtain the set of truncated periodic components.

4. The method of claim 1, further comprising:
combining the amplified set of truncated periodic components to obtain an output signal.

5. A user equipment device, comprising:
a circuitry operable to:
generate a set of periodic components based on a set of quantization bits that represents a quantized amplitude of a sample of an input signal having information and a set of periodic component activation indications that indicates which of the set of periodic components is activated or deactivated; and
output a set of truncated periodic components that collectively represents the input signal sample; and
a set of power amplifier circuitry electrically coupled to the circuitry and operable to amplify the set of truncated periodic components that collectively represents an amplified sample of the input signal.

6. The device of claim 5, further comprising:
a first circuitry operable to compute an amplitude and a phase of the sample;
a second circuitry operable to quantize the amplitude to obtain the set of quantization bits that represents the quantized amplitude of the sample; and
a mapper circuitry operable to decompose the set of quantization bits that represents the quantized amplitude of the sample to obtain the set of periodic component activation indications that indicates which of the set of periodic components is activated or deactivated.

7. The device of claim 5, further comprising:
a truncation circuitry operable to truncate the set of periodic components to a certain sample period to obtain the set of truncated periodic components.

8. The device of claim 5, further comprising:
a combiner circuitry operable to combine the amplified set of truncated periodic components to obtain an output signal.

9. A method, comprising:
generating, by a circuitry, a set of periodic components based on a set of quantization bits that represents a quantized amplitude of a sample of an input signal having information and a set of periodic component activation indications that indicates which of the set of periodic components is activated or deactivated; and
amplifying, by a set of power amplifier circuitry, a set of truncated periodic components that collectively represents an amplified sample of the input signal.

10. The method of claim 9, further comprising:
computing an amplitude and a phase of the sample;
quantizing the amplitude to obtain the set of quantization bits that represents the quantized amplitude of the sample; and
decomposing the set of quantization bits that represents the quantized amplitude of the sample to obtain the set of periodic component activation indications that indicates which of the set of periodic components is activated or deactivated.

11. The method of claim 9, further comprising:
truncating the set of periodic components to a certain sample period to obtain the set of truncated periodic components.

12. The method of claim 9, further comprising:
combining the amplified set of truncated periodic components to obtain an output signal.

13. A user equipment device, comprising:
a circuitry operable to generate a set of periodic components based on a set of quantization bits that represents a quantized amplitude of a sample of an input signal having information and a set of periodic component activation indications that indicates which of the set of periodic components is activated or deactivated; and
a set of power amplifier circuitry operable to amplify a set of truncated periodic components that collectively represents an amplified sample of the input signal.

14. The device of claim 13, further comprising:
a first circuitry operable to compute an amplitude and a phase of the sample;
a second circuitry operable to quantize the amplitude to obtain the set of quantization bits that represents the quantized amplitude of the sample; and
a mapper circuitry operable to decompose the set of quantization bits that represents the quantized amplitude of the sample to obtain the set of periodic component activation indications that indicates which of the set of periodic components is activated or deactivated.

15. The device of claim 13, further comprising:
a truncation circuitry operable to truncate the set of periodic components to a certain sample period to obtain the set of truncated periodic components.

16. The device of claim 13, further comprising:
a combiner circuitry operable to combine the amplified set of truncated periodic components to obtain an output signal.

\* \* \* \* \*